US012665047B2

(12) United States Patent
Lu et al.

(10) Patent No.: US 12,665,047 B2
(45) Date of Patent: Jun. 23, 2026

(54) USAGE-BASED DISTURBANCE COUNTER REPAIR

(71) Applicant: Micron Technology, Inc., Boise, ID (US)

(72) Inventors: Yang Lu, Boise, ID (US); Yuan He, Boise, ID (US); Kang-Yong Kim, Boise, ID (US); Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 132 days.

(21) Appl. No.: 18/634,096

(22) Filed: Apr. 12, 2024

(65) Prior Publication Data

US 2024/0363191 A1 Oct. 31, 2024

Related U.S. Application Data

(60) Provisional application No. 63/498,333, filed on Apr. 26, 2023.

(51) Int. Cl.
G11C 29/00 (2006.01)
(52) U.S. Cl.
CPC ............ G11C 29/76 (2013.01); G11C 29/789 (2013.01)

(58) Field of Classification Search
CPC .................. G11C 29/76; G11C 29/789; G11C 2029/0409
See application file for complete search history.

(56) References Cited

U.S. PATENT DOCUMENTS

| | | | | | |
|---|---|---|---|---|---|
| 6,032,264 A | * | 2/2000 | Beffa | ..................... | G11C 29/72 714/6.32 |
| 6,539,506 B1 | * | 3/2003 | Lammers | ............... | G11C 29/44 714/704 |
| 2003/0169634 A1 | * | 9/2003 | Kilmer | .................. | G11C 11/406 365/222 |

* cited by examiner

*Primary Examiner* — Mohammed A Bashar
(74) *Attorney, Agent, or Firm* — Colby Nipper PLLC

(57) ABSTRACT

Apparatuses and techniques for implementing usage-based disturbance (UBD) counter repair are described. In example implementations, a memory device includes multiple memory rows, multiple corresponding UBD counters, a register, and a spare UBD counter. If a UBD counter is faulty, logic can substitute the spare UBD counter. To do so, the logic can store a row address corresponding to the faulty UBD counter in the register. The logic can increment a value in the spare UBD counter responsive to a row activation corresponding to the stored row address. A mitigation procedure on a row that may be affected by the activation can be performed based on the value. A host device can control, at least partially, the UBD counter repair process. In these manners, a repair of a faulty UBD counter can be accomplished faster and/or with fewer resources as compared to replacing a memory row and corresponding UBD counter.

20 Claims, 9 Drawing Sheets

100

Apparatus
102

Host Device
104

Processor
110

Cache Memory
112

Memory Controller
114

UBD CRpC   118

116 — Interconnect
106

Memory Device
108

UBD Counter Repair Circuitry (CRpC)
120

Spare UBD Counter
122

UBD Counters
124-1 ...124-N

— 102-1
IoT ↔

— 102-2

— 102-3

— 102-4

— 102-5

— 102-6

— 102-7

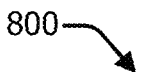

800

802

Transmit to a memory device a first command that relates to repairing a faulty usage-based disturbance counter using a spare usage-based disturbance counter that is configured to be assignable to multiple memory row addresses

804

Transmit to the memory device a second command that relates to the repairing of the faulty usage-based disturbance counter using the spare usage-based disturbance counter

*FIG. 8*

900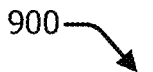

```
┌─────────────────────────────────────┐
│                 902                  │
│                                      │
│        Receive from a host device a first        │
│     command that relates to repairing a faulty   │
│      usage-based disturbance counter using a     │
│       spare usage-based disturbance counter      │
│    configured to be assignable to different memory│
│    row addresses of multiple memory row addresses│
└─────────────────────────────────────┘
                    │
                    ▼
┌─────────────────────────────────────┐
│                 904                  │
│                                      │
│    Receive from the host device a second command │
│       that relates to the repairing of the faulty│
│      usage-based disturbance counter using the   │
│        spare usage-based disturbance counter     │
└─────────────────────────────────────┘
```

*FIG. 9*

USAGE-BASED DISTURBANCE COUNTER REPAIR

CROSS-REFERENCE TO RELATED APPLICATION(S)

This application claims the benefit of U.S. Provisional Patent Application No. 63/498,333 filed on Apr. 26, 2023, the disclosure of which is incorporated by reference herein in its entirety.

BACKGROUND

Computers, smartphones, and other electronic devices rely on processors and memories. A processor executes code based on data to run applications and provide features to a user. The processor obtains the code and the data from a memory. The memory in an electronic device can include volatile memory (e.g., random-access memory (RAM)) and non-volatile memory (e.g., flash memory). Like the capabilities of a processor, the capabilities of a memory can impact the performance of an electronic device. This performance impact can increase as processors are developed that execute code faster and as applications operate on increasingly larger data sets that require ever-larger memories.

BRIEF DESCRIPTION OF THE DRAWINGS

Apparatuses and techniques for implementing usage-based disturbance counter repair are described with reference to the following drawings. The same numbers are used throughout the drawings to reference like features and components:

FIG. 8 illustrates an example method for implementing aspects of usage-based disturbance counter repair for a host device; and FIG. 9 illustrates an example method for implementing aspects of usage-based disturbance counter repair for a memory device.

DETAILED DESCRIPTION

Overview

Figure 1:
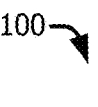
FIG. 1 illustrates example apparatuses that can implement aspects of usage-based disturbance counter repair.

Processors and memory work in tandem to provide features to users of computers and other electronic devices. As processors and memory operate more quickly together in a complementary manner, an electronic device can provide enhanced features, such as high-resolution graphics and artificial intelligence (AI) analysis. Some applications, such as those for financial services, medical devices, and advanced driver assistance systems (ADAS), can also demand more-reliable memories. These applications use increasingly reliable memories to limit errors in financial transactions, medical decisions, and object identification. However, in some implementations, more-reliable memories can sacrifice bit densities, power efficiency, and simplicity.

To meet the demands for physically smaller or more power-efficient memories, memory devices can be designed with higher chip densities in which components are placed ever closer together on a chip. These components may also be fabricated to be smaller and smaller. Increasing chip density, however, can increase the electromagnetic coupling (e.g., capacitive coupling) between adjacent or proximate rows of memory cells due at least partly to the shrinking distance between these memory rows. With this undesired coupling, activation (or charging) of a first row of memory cells can sometimes negatively impact a second nearby row of memory cells.

In particular, activation of the first row can generate interference, or crosstalk, that causes the second or affected row to experience a voltage fluctuation. In some instances, this voltage fluctuation can cause a state (or value) of a memory cell in the second row to be incorrectly determined by a sense amplifier. Consider an example in which a state of a memory cell in the second row is a "1" based on a voltage that is initially stored therein. In this example, the voltage fluctuation can cause a sense amplifier to incorrectly determine the state of the memory cell to be a "0" instead of a "1" based on a change to the stored voltage. Left unchecked, this interference can lead to memory errors or data loss within the memory device.

In some circumstances, a particular row of memory cells is activated repeatedly in an unintentional or intentional (sometimes even malicious) manner. Consider, for instance, that memory cells in an $R^{th}$ row are subjected to repeated activation. This can cause one or more memory cells in an adjacent row or another proximate row (e.g., within an R+1 row, an R+2 row, an R−1 row, and/or an R−2 row) to change states. This effect is referred to herein as a usage-based disturbance (UBD). The occurrence of usage-based disturbances can lead to the corruption or changing of contents within an affected row of memory.

Some memory devices utilize circuits that can detect usage-based disturbance and mitigate its effects. For example, a memory device may include multiple usage-based disturbance counters. Each usage-based disturbance counter can correspond to a row of a memory array. The usage-based disturbance counter keeps track of a quantity of accesses or activations of the corresponding memory row. For instance, usage-based disturbance counter circuitry can increment the tracked quantity in the usage-based disturbance counter responsive to each activation of the corresponding memory row. If the tracked quantity in the counter meets a threshold value, proximate rows, including adjacent rows, may be at increased risk for data corruption due to the repeated activations of the accessed row and the usage-based disturbance effect. To manage this risk to affected rows, the circuitry can compare the quantity stored in the usage-based disturbance counter to at least one threshold value as the stored quantity is incremented over time.

If the stored quantity meets the threshold value (e.g., if the quantity violates the threshold by being equal to or greater than the threshold value), the usage-based disturbance counter circuitry can perform a mitigation procedure. The mitigation procedure can entail performing an activation on one or more of the affected rows that are proximate to the activated row to mitigate the risk of data corruption. By activating the affected rows, the "correct" voltages stored in the memory cells are reinstated to a "full" level, whether the "full" level is a low voltage, a high voltage, or a another designated voltage level or range. Thus, if the proximate rows are activated before a state of any memory cells are changed due to the usage-based disturbance effect, the correct states can be maintained even under repeated accesses to the activated row.

Once one or more proximate rows have been activated to reinstate the correct voltage level, or memory state value, the usage-based disturbance counter circuitry can clear the stored value in the usage-based disturbance counter that corresponds to the repeatedly activated row. Thus, the count value can start being incremented again. This increasing of the count values across multiple usage-based disturbance counters may continue until a respective value in each counter violates the threshold, at which time a mitigation procedure may be performed to activate affected proximate rows and to clear the corresponding usage-based disturbance counter. Generally, this provides a desired protective feature: reducing the probability that repeated activations of a given memory row that cause the usage-based disturbance effect can corrupt data in proximate memory rows.

The effectiveness of this protective feature is jeopardized, however, if a usage-based disturbance counter malfunctions or is otherwise faulty. For example, a faulty usage-based disturbance counter may fail to increment responsive to activation of the corresponding memory row, may fail to be cleared after a mitigation procedure, may fail to retain a stored value, and so forth. This exposes the memory device to potential data corruption. To counteract this potential data corruption, at least one spare usage-based disturbance counter can be included in the memory device. A spare usage-based disturbance counter can be substituted in, or otherwise employed, if a "regular" usage-based disturbance counter fails.

In some memory architectures, each memory row of a memory array corresponds to a respective usage-based disturbance counter that may be disposed proximate to, or may even be part of, the memory array. In at least some of these architectures, data and a counter value may be stored in a combination counter and memory row. These architectures can employ approaches that repair a faulty usage-based disturbance counter by replacing the faulty counter in conjunction with replacing the corresponding memory row with a combination spare usage-based disturbance counter and memory row. These replacement procedures can be performed in a permanent (or "hard") manner or in a temporary (or "soft") manner, examples of which are described next.

With a hard post-package repair (hPPR) mechanism, a computing system (e.g., a host device) can request that a memory device permanently repair a whole combination row, including a faulty usage-based disturbance counter. With this mechanism, however, the viability of existing data stored in the memory row is uncertain. Further, the permanent, nonvolatile nature of this hPPR mechanism can entail performing a procedure that involves blowing a fuse. The procedure is relatively lengthy and can often be performed only during power up and initialization, or with a full memory reset, instead of in real-time while the memory device is functional and performing memory operations for the host device.

In contrast with the hPPR mechanism, a soft post-package repair (sPPR) mechanism is a temporary repair procedure that is significantly faster. Further, although an sPPR procedure produces a volatile repair, the sPPR procedure can be performed in real-time responsive to detection of a failed counter. If a memory row is being repaired, the computing system may be responsible, however, for handling the data transfer (e.g., a full page of data) from the memory row corresponding to the faulty usage-based disturbance counter to a spare counter and memory row combination. This data transfer can consume an appreciable amount of time while occupying the data bus.

Moreover, with the hPPR or sPPR mechanisms described above that replace an entire memory row, a whole spare counter and memory row combination, which have a limited available quantity, is utilized even though only the counter portion of the combination counter and memory row is faulty. This can be particularly relevant as the usage-based disturbance counter storing a counter value may be appreciably smaller than the memory row storing the data. In other words, a usage-based disturbance counter may have appreciably fewer bits by at least an order of magnitude as compared to a quantity of bits used for the data stored in the memory row.

To address these and other issues relating to usage-based disturbance counters, this document describes aspects of usage-based disturbance counter repair. For example, a memory device can include at least one spare usage-based disturbance counter that is assignable to different memory row addresses. The spare usage-based disturbance counter may, for instance, be re-assignable over time to different memory row addresses or be sequentially assignable to different ones of multiple memory row addresses. At some point, a usage-based disturbance counter that corresponds to a memory row having a specified memory row address can fail. The failure can be detected by, for example, the memory device or a host device that is coupled to the memory device.

Based on the usage-based disturbance counter becoming faulty, usage-based disturbance counter repair circuitry can assign the specified memory row address to the spare usage-based disturbance counter. While this row-address assignment is in effect, the usage-based disturbance counter repair circuitry can operate the spare usage-based disturbance counter like usage-based disturbance counter operational circuitry interacts with a non-faulty usage-based disturbance counter corresponding to a memory row. Such operations can include incrementing the counter value of the spare usage-based disturbance counter, performing a mitigation procedure based on the counter value, and clearing the counter value responsive to the mitigation procedure.

In example implementations, a memory device can include multiple memory rows of a memory array and multiple usage-based disturbance counters corresponding to the multiple memory rows. The memory device can also include usage-based disturbance counter repair circuitry having a register and a spare usage-based disturbance counter, such as one apiece per memory bank. If a usage-based disturbance counter of the multiple usage-based disturbance counters is faulty, the usage-based disturbance counter repair circuitry can substitute in the spare usage-based disturbance counter in real-time. To perform a counter repair procedure in real-time, the usage-based disturbance counter repair circuitry can store a memory row address corresponding to the faulty usage-based disturbance counter in the register and clear the spare usage-based disturbance counter to prepare for activation tracking.

With further memory operations, the usage-based disturbance counter repair circuitry can increment a value in the spare usage-based disturbance counter responsive to a row activation corresponding to the stored memory row address. Data present in the memory row of the memory array can remain in the memory row even as row activations are being tracked in the spare usage-based disturbance counter. This can enable the repair procedure to be performed more quickly and with fewer resources because a spare memory row need not be utilized. Because the memory row in the memory array continues to be used, a mitigation procedure on one or more memory rows that may be affected by activation of the memory row in the memory array can be performed based on the counter value stored in the spare usage-based disturbance counter, as well as being based on at least one threshold value.

The usage-based disturbance counter repair can continue to be in effect until power is removed or a new memory row address is stored in the register in accordance with a soft post-package repair (sPPR) mechanism that replaces a faulty usage-based disturbance counter separately from a corresponding (non-faulty) memory row. Thus, certain aspects of the usage-based disturbance counter substitution that is described herein can be implemented as a volatile repair that is performed in real-time without resetting or reinitializing the memory device. Although a single register and spare usage-based disturbance counter pair is explicitly described above, usage-based disturbance counter repair circuitry may include multiple such register and spare-counter pairs to enable multiple faulty usage-based disturbance counters to be in a repaired state simultaneously. Alternatively, a "new" memory row repair address can replace an "old" memory row repair address.

In some environments, a host device can control, at least partially, the usage-based disturbance counter repair procedure performed in a memory device. This control can entail transmitting commands from the host device to the memory device. Such commands can include a command causing entry into or exit from a repair mode or a command that provides a memory row address to target for the repair procedure. To facilitate this communication, the memory device may include one or more mode registers having at least one bit relating to usage-based disturbance counter repair functionality. Alternatively or additionally, the host device can transmit a multi-purpose command (MPC) to the memory device to control a usage-based disturbance counter repair procedure.

Generally, a memory device or a host device may detect that a usage-based disturbance counter is faulty. Additionally, a memory device or a host device may initiate or otherwise control at least part of a repair procedure to replace the faulty usage-based disturbance counter as described herein. Further, a device or a system may implement any permutation of these actions. For instance, a memory device may detect that a usage-based disturbance counter is faulty and report this to a host device, and the host device may then control a repair procedure of the faulty usage-based disturbance counter. Alternatively, a memory device may detect that a usage-based disturbance counter is faulty and then control a repair procedure of the faulty usage-based disturbance counter, with or without notifying an associated host device. In some cases, a host device may authorize or provide permission to a memory device to perform the repair procedure automatically—e.g., in response to detection of a faulty usage-based disturbance counter by the memory device without the memory device being commanded or controlled by the host device to perform the repair procedure. In other cases, the memory device may "intrinsically" possess the authority to perform a repair procedure automatically without needing to be granted such authority.

In these manners, a repair of a faulty usage-based disturbance counter can be accomplished faster and/or with fewer resources as compared to replacing a combined memory row and corresponding usage-based disturbance counter. In contrast with a nonvolatile hPPR mechanism, described repair procedure aspects can be performed in the field without stopping operations to reset or restart the memory device. In contrast with a volatile sPPR mechanism that replaces an entire usage-based disturbance counter and corresponding memory row, described repair procedure aspects can be performed by replacing the faulty usage-based disturbance counter with a spare usage-based disturbance counter while continuing to use the still-functional memory row in the memory array. This can reserve spare counter and memory row combinations for failures in the usually much-larger memory row portion of the combination. These and other implementations are described herein.

Example Operating Environments

FIG. 1 illustrates, at 100 generally, an example operating environment including an apparatus 102 that can implement aspects of usage-based disturbance counter repair. The apparatus 102 can include various types of electronic devices, including an internet-of-things (IoT) device 102-1, tablet device 102-2, smartphone 102-3, notebook computer 102-4, passenger vehicle 102-5, server computer 102-6, and server cluster 102-7 that may be part of cloud computing infrastructure, a data center, or a portion thereof (e.g., a printed circuit board (PCB)). Other examples of the apparatus 102 include a wearable device (e.g., a smartwatch or intelligent glasses), entertainment device (e.g., a set-top box, video dongle, smart television, a gaming device), desktop computer, motherboard, server blade, consumer appliance, vehicle, drone, industrial equipment, security device, sensor, medical device, or the electronic components thereof. Each type of apparatus can include one or more components to provide computing functionalities or features.

In example implementations, the apparatus 102 can include at least one host device 104, at least one interconnect 106, and at least one memory device 108. The host device 104 can include at least one processor 110, at least one cache memory 112, and at least one memory controller 114. The memory device 108, which can also be realized with a memory module, can include, for example, a dynamic random-access memory (DRAM) die or module (e.g., Low-Power Double Data Rate synchronous DRAM (LPDDR SDRAM)). The DRAM die or module can include a three-dimensional (3D) stacked DRAM device, which may be a high-bandwidth memory (HBM) device or a hybrid memory cube (HMC) device. The memory device 108 can operate as a main memory for the apparatus 102. Although not illustrated, the apparatus 102 can also include storage memory. The storage memory can include, for example, a storage-class memory device (e.g., flash memory, hard disk drive, solid-state drive, phase-change memory (PCM), or memory employing 3D XPoint™).

The processor 110 is operatively coupled to the cache memory 112, which is operatively coupled to the memory controller 114. The processor 110 is also coupled, directly or indirectly, to the memory controller 114. The host device 104 may include other components to form, for instance, a system-on-a-chip (SoC). The processor 110 may include a general-purpose processor, central processing unit, graphics processing unit (GPU), neural network engine or accelerator, application-specific integrated circuit (ASIC), field-programmable gate array (FPGA) integrated circuit (IC), or communications processor (e.g., a modem or baseband processor).

In operation, the memory controller 114 can provide a high-level or logical interface between the processor 110 and at least one memory (e.g., an external memory). The memory controller 114 may be realized with any of a variety of suitable memory controllers (e.g., a double-data-rate (DDR) memory controller that can process requests for data stored on the memory device 108). Although not shown, the host device 104 may include a physical interface (PHY) that transfers data between the memory controller 114 and the memory device 108 through the interconnect 106. For example, the physical interface may be an interface that is compatible with a DDR PHY Interface (DFI) Group interface protocol. The memory controller 114 can, for example, receive memory requests from the processor 110 and provide the memory requests to external memory with appropriate formatting, timing, and reordering. The memory controller 114 can also forward to the processor 110 responses to the memory requests received from the external memory.

The host device 104 is operatively coupled, via the interconnect 106, to the memory device 108. In some examples, the memory device 108 is connected to the host device 104 via the interconnect 106 with an intervening buffer or cache. The memory device 108 may operatively couple to storage memory (not shown). The host device 104 can also be coupled, directly or indirectly via the interconnect 106, to the memory device 108 and the storage memory. The interconnect 106 and other interconnects (not illustrated in FIG. 1) can transfer data between two or more components of the apparatus 102. Examples of the interconnect 106 include a bus (e.g., a unidirectional or bidirectional bus), a switching fabric, or one or more wires that carry voltage or current signals. The interconnect 106 can propagate one or more communications 116, such as memory requests or memory responses, between the host device 104 and the memory device 108. For example, the host device 104 may transmit a memory request to the memory device 108 over the interconnect 106. Also, the memory device 108 may transmit a corresponding memory response to the host device 104 over the interconnect 106.

In other implementations, the interconnect 106 can be realized as a Compute Express Link™ (CXL™) protocol link (CXL link). In other words, the interconnect 106 can comport with at least one CXL standard or protocol. The CXL link can provide an interface on top of the physical layer and electricals of a PCIe 5.0 physical layer, for instance. The CXL link can cause requests to and responses from the memory device 108 to be packaged as flits. In still other implementations, the interconnect 106 can be another type of link, including a PCIe 5.0 link. In this document, some terminology may draw from one or more identified standards or versions thereof, like a CXL standard or an LPDDR5 standard, for clarity. The described principles, however, are also applicable to memories and systems that comport with other standards and types of interconnects.

The illustrated components of the apparatus 102 represent an example architecture with a hierarchical memory system. A hierarchical memory system may include memories at different levels, with each level having memory with a different speed or capacity. As illustrated, the cache memory 112 logically couples the processor 110 to the memory device 108. In the illustrated implementation, the cache memory 112 is at a higher level than the memory device 108. A storage memory, in turn, can be at a lower level than the main memory (e.g., lower than a level of the memory device 108). Memory at lower hierarchical levels may have a decreased speed but increased capacity relative to memory at higher hierarchical levels.

The apparatus 102 can be implemented in various manners with more, fewer, or different components. For example, the host device 104 may include multiple cache memories (e.g., including multiple levels of cache memory) or no cache memory. In other implementations, the host device 104 may omit the processor 110 or the memory controller 114. A memory (e.g., the memory device 108) may have an "internal" or "local" cache memory (not shown in FIG. 1). As another example, the apparatus 102 may include cache memory between the interconnect 106 and the memory device 108. Computer engineers can also include any of the illustrated components in distributed or shared memory systems.

This document describes with reference to FIG. 1 an example computing system architecture having at least one host device 104 coupled to a memory device 108. Computer engineers, however, may implement the host device 104 and the various memories in multiple manners. In some cases, the host device 104 and the memory device 108 can be disposed on, or physically supported by, a printed circuit board (e.g., a rigid or flexible motherboard). The host device 104 and the memory device 108 may additionally be integrated together on an integrated circuit or fabricated on separate integrated circuits and packaged together. The memory device 108 may also be coupled to multiple host devices 104 via one or more interconnects 106 and may respond to memory requests from two or more host devices 104. Each host device 104 may include a respective memory controller 114, or the multiple host devices 104 may share a memory controller 114.

Two or more memory components (e.g., modules, dies, banks, or bank groups) can share the electrical paths or couplings of the interconnect 106. In some cases, the interconnect 106 can include at least one command-and-address bus (CA bus) and at least one data bus (DQ bus). The command-and-address bus can transmit addresses and commands from the memory controller 114 of the host device 104 to the memory device 108, and this bus may exclude propagation of data. The data bus can propagate data between the memory controller 114 and the memory device 108. The memory device 108 may also be implemented as any suitable memory including, but not limited to, DRAM, SDRAM, three-dimensional (3D) stacked DRAM, DDR memory, or LPDDR memory (e.g., LPDDR DRAM or LPDDR SDRAM). Other examples of realizations for at least the memory device 108 include computational storage apparatuses, such as Computational Storage Devices (CSXs), Computational Storage Processors (CSPs), Computational Storage Drives (CSDs), and Computational Storage Arrays (CSAs).

Figure 2:
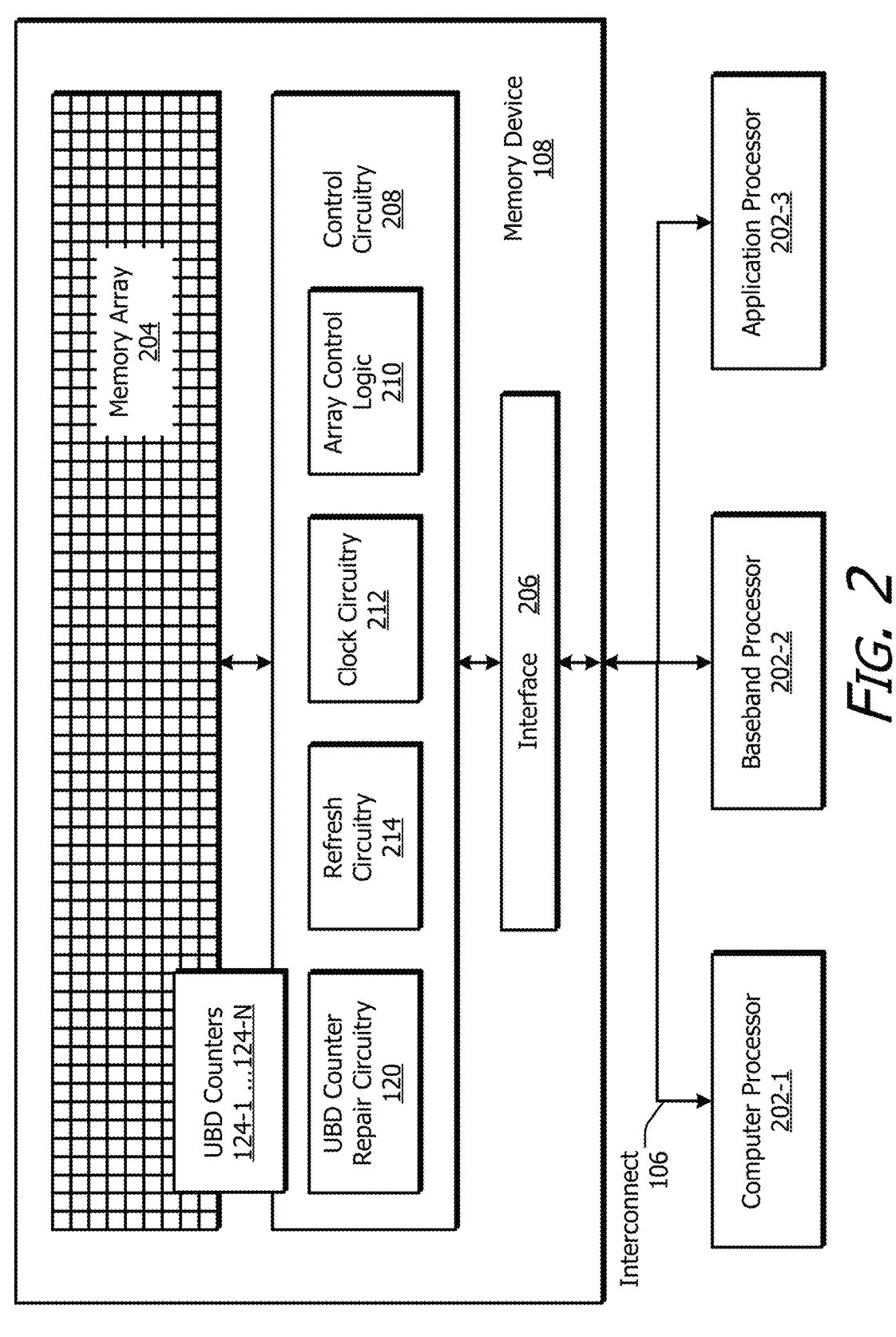
FIG. 2 illustrates an example computing system that can implement aspects of usage-based disturbance counter repair with respect to a memory device.
Figure 4:
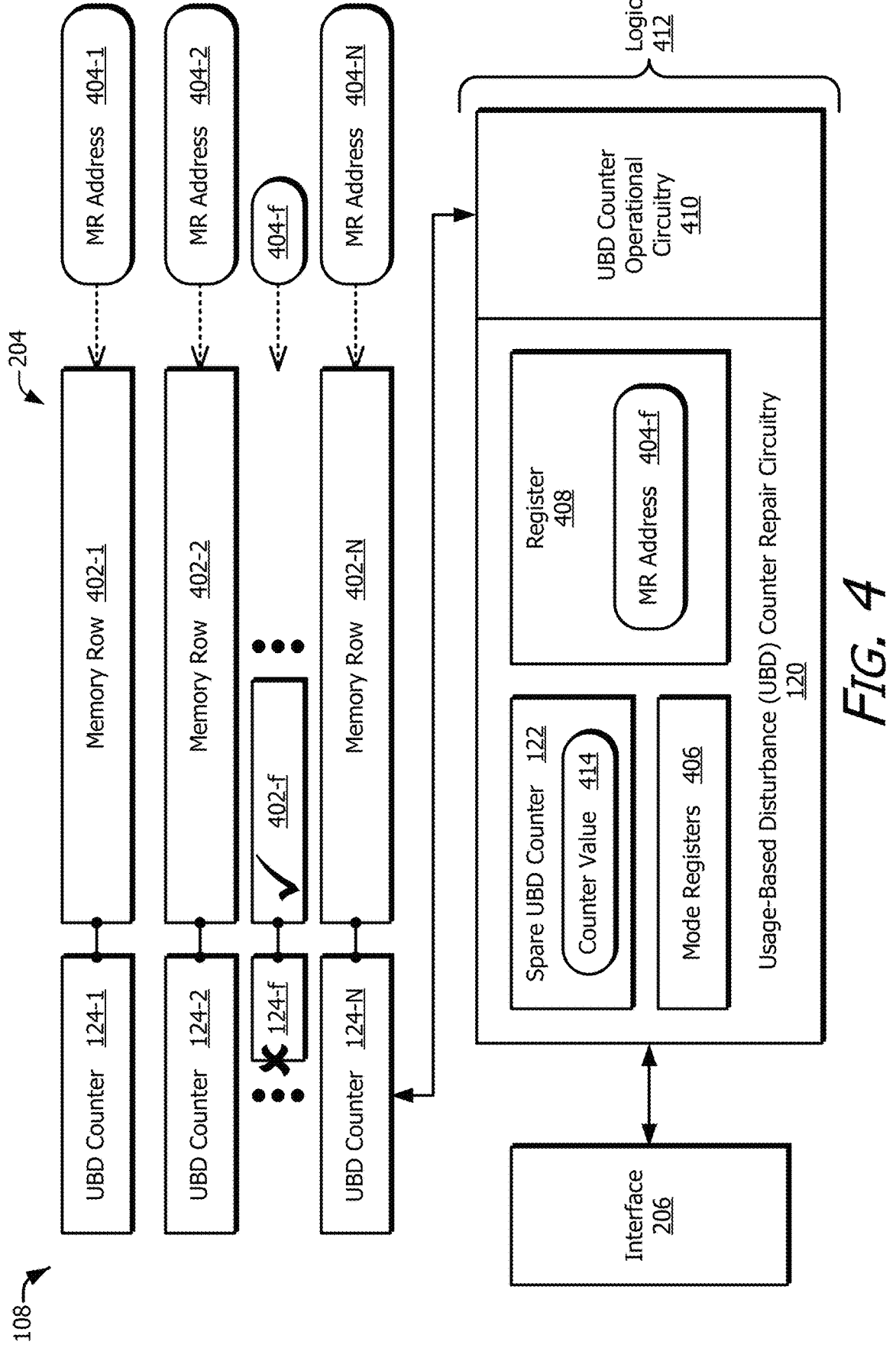
FIG. 4 illustrates a schematic diagram of an example memory device that includes usage-based disturbance counter repair circuitry and multiple usage-based disturbance counters.

The memory device 108 can form at least part of the main memory of the apparatus 102. The memory device 108 may, however, form at least part of a cache memory, a storage memory, or a system-on-chip of the apparatus 102. The memory device 108 can include at least one memory array (e.g., as shown in FIGS. 2 and 4) and at least one instance of usage-based disturbance counter repair circuitry 120 (UBD counter repair circuitry (CRpC) 120 or UBD CRpC 120). The memory device 108 can also include multiple usage-based disturbance counters 124-1 . . . 124-N (multiple UBD counters 124-1 . . . 124-N), such as at least one UBD counter 124, where N represents a positive integer. The UBD counter repair circuitry 120 can include at least one spare usage-based disturbance counter 122 (spare UBD counter 122).

In example implementations, the UBD counter repair circuitry 120 can be coupled to the multiple usage-based disturbance counters 124-1 . . . 124-N, one of which may become faulty. The UBD counter repair circuitry 120 can use the spare UBD counter 122 to repair (e.g., at least temporarily replace) a faulty UBD counter 124 (not separately shown) of the multiple UBD counters 124-1 . . . 124-N. Examples of architectures for a memory device 108 and the UBD counter repair circuitry 120 thereof are described below with reference to FIG. 4.

As shown in FIG. 1, the host device 104, such as a memory controller 114 thereof, can include at least one instance of usage-based disturbance counter repair circuitry 118 (UBD counter repair circuitry 118 or UBD CRpC 118). In some implementations, a usage-based disturbance counter repair procedure at the memory device 108 may be controlled, at least partially, by the UBD counter repair circuitry 118 at the host device 104. For example, the UBD counter repair circuitry 118 can transmit one or more commands to the memory device 108 directing the UBD counter repair circuitry 120 to perform the repair procedure. Examples of such communications 116 across the interconnect 106 are described below with reference to FIG. 6. Next, however, this document describes examples of the memory device 108 with reference to FIG. 2.

FIG. 2 illustrates an example computing system 200 that can implement aspects of usage-based disturbance counter repair with respect to a memory device 108. In some implementations, the computing system 200 includes at least one memory device 108, at least one interconnect 106, and at least one processor 202. The memory device 108 can include, or be associated with, at least one memory array 204, at least one interface 206, and control circuitry 208 (or periphery circuitry) operatively coupled to the memory array 204. The memory array 204 can include an array of memory cells, including but not limited to memory cells of DRAM, SDRAM, three-dimensional (3D) stacked DRAM, DDR memory, LPDDR SDRAM, and so forth. The memory array 204 and the control circuitry 208 may be components on a single semiconductor die or on separate semiconductor dies. The memory array 204 or the control circuitry 208 may also be distributed across multiple dies. The control circuitry 208 may manage traffic on a bus that is separate from the interconnect 106, such as an internal bus of the memory device 108.

The control circuitry 208 can include various components that the memory device 108 can use to perform various operations. These operations can include communicating with other devices, managing memory performance, performing refresh operations (e.g., self-refresh operations or auto-refresh operations for DRAM), and performing memory read or write operations. For example, the control circuitry 208 can include at least one instance of array control logic 210, clock circuitry 212, refresh circuitry 214, UBD counter repair circuitry 120, and multiple UBD counters 124-1 . . . 124-N. The array control logic 210 can include circuitry that provides command decoding, address decoding, input/output functions, amplification circuitry, power supply management, power control modes, sense amplifying for data retrieval operations, write driving for data storage operations, and other functions.

The clock circuitry 212 can synchronize various memory components with one or more external clock signals provided over the interconnect 106, including a command-and-address clock or a data clock. The clock circuitry 212 can also or instead use an internal clock signal to synchronize memory components, and the clock circuitry 212 may provide timer functionality. The refresh circuitry 214 can perform refresh operations on the memory array 204 (if the memory array 204 includes DRAM cells) in a self-refresh mode or an auto-refresh mode. Although not shown in FIG. 2, the control circuitry 208 may include one or more mode registers to facilitate control by and/or communication with a processor 202.

The multiple UBD counters 124-1 . . . 124-N can be disposed with and/or integrated with the control circuitry 208 and/or the memory array 204. Alternatively or additionally, at least a portion of the multiple UBD counters 124-1 . . . 124-N may be positioned elsewhere and/or be incorporated into other circuitry. In example operations, the UBD counter repair circuitry 120 can repair a faulty UBD counter 124 of the multiple UBD counters 124-1 . . . 124-N using a spare UBD counter 122 (e.g., of FIGS. 1, 4, and 7). For example, the UBD counter repair circuitry 120 can repair a faulty UBD counter 124 corresponding to a memory row of the memory array 204 using the spare UBD counter 122. The UBD counter repair circuitry 120 may, for instance, temporarily replace the functionality of the faulty UBD counter 124 with that of the spare UBD counter 122. These interactions and operations are described further below with reference to FIGS. 4 and 7.

The interface 206 can couple the control circuitry 208 or the memory array 204 directly or indirectly to the interconnect 106. In some implementations, the UBD counter repair circuitry 120, the multiple UBD counters 124-1 . . . 124-N, the array control logic 210, the clock circuitry 212, and the refresh circuitry 214 can be part of a single component (e.g., the control circuitry 208). In other implementations, one or more of the UBD counter repair circuitry 120, the multiple UBD counters 124-1 . . . 124-N, the array control logic 210, the clock circuitry 212, or the refresh circuitry 214 may be implemented as separate components, which can be provided on a single semiconductor die or disposed across multiple semiconductor dies. These components may individually or jointly couple to the interconnect 106 via the interface 206.

The interconnect 106 may use one or more of a variety of interconnects that communicatively couple together various components and enable commands, addresses, or other information and data to be transferred between two or more components (e.g., between the memory device 108 and a processor 202). Although the interconnect 106 is illustrated with a single line in FIG. 2, the interconnect 106 may include at least one bus, at least one switching fabric, one or more wires or traces that carry voltage or current signals, at least one switch, one or more buffers, and so forth. Further, the interconnect 106 may be separated into at least a command-and-address bus and a data bus. Also, as discussed above with respect to FIG. 1 and below with respect to FIG. 3, the interconnect 106 can include a CXL link or comport with at least one CXL standard. The CXL link can provide an interface or overlay on top of the physical layer and electricals of, e.g., a PCIe 5.0 physical layer.

In some aspects, the memory device 108 may be a "separate" component relative to the host device 104 (of FIG. 1) or any of the processors 202. The separate components can include a printed circuit board, memory card, memory stick, or memory module (e.g., a single in-line memory module (SIMM) or dual in-line memory module (DIMM)). Separate physical components may be located together within the same housing of an electronic device or may be distributed over a server rack, a data center, and so forth. Alternatively, the memory device 108 may be integrated with other physical components, including the host device 104 or the processor 202, by being combined together on a printed circuit board, in a single package, or in a system-on-chip (SoC).

As shown in FIG. 2, the one or more processors 202 may include a computer processor 202-1, a baseband processor 202-2, and/or an application processor 202-3 that are coupled to the memory device 108 through the interconnect 106. The processors 202 may include or form a part of a central processing unit (CPU), graphics processing unit (GPU), system-on-chip (SoC), application-specific integrated circuit (ASIC), or field-programmable gate array (FPGA). In some cases, a single processor can comprise multiple processing resources or cores, each dedicated to different functions (e.g., modem management, applications, graphics, security, artificial intelligence (AI), or central processing). In some implementations, the baseband processor 202-2 may include or be coupled to a modem (not illustrated in FIG. 2) and referred to as a modem processor. The modem or the baseband processor 202-2 may be coupled wirelessly to a network via, for example, cellular, Wi-Fi®, Bluetooth®, near field, or another technology or protocol for wireless communication.

In some implementations, the processors 202 may be connected directly to the memory device 108 (e.g., via the interconnect 106). In other implementations, one or more of the processors 202 may be indirectly connected to the memory device 108 (e.g., over a network connection or through one or more other devices). Further, the processor 202 may be realized as one that can communicate over a CXL-compatible interconnect. Accordingly, a respective processor 202 can include or be associated with a respective link controller. Alternatively, two or more processors 202 may access the memory device 108 using a shared link controller. In some of such cases, the memory device 108 may be implemented as a CXL-compatible memory device (e.g., as a CXL Type 3 memory expander), or another memory device that is compatible with a CXL protocol may also or instead be coupled to the interconnect 106.

Example Techniques and Hardware

Figure 3:
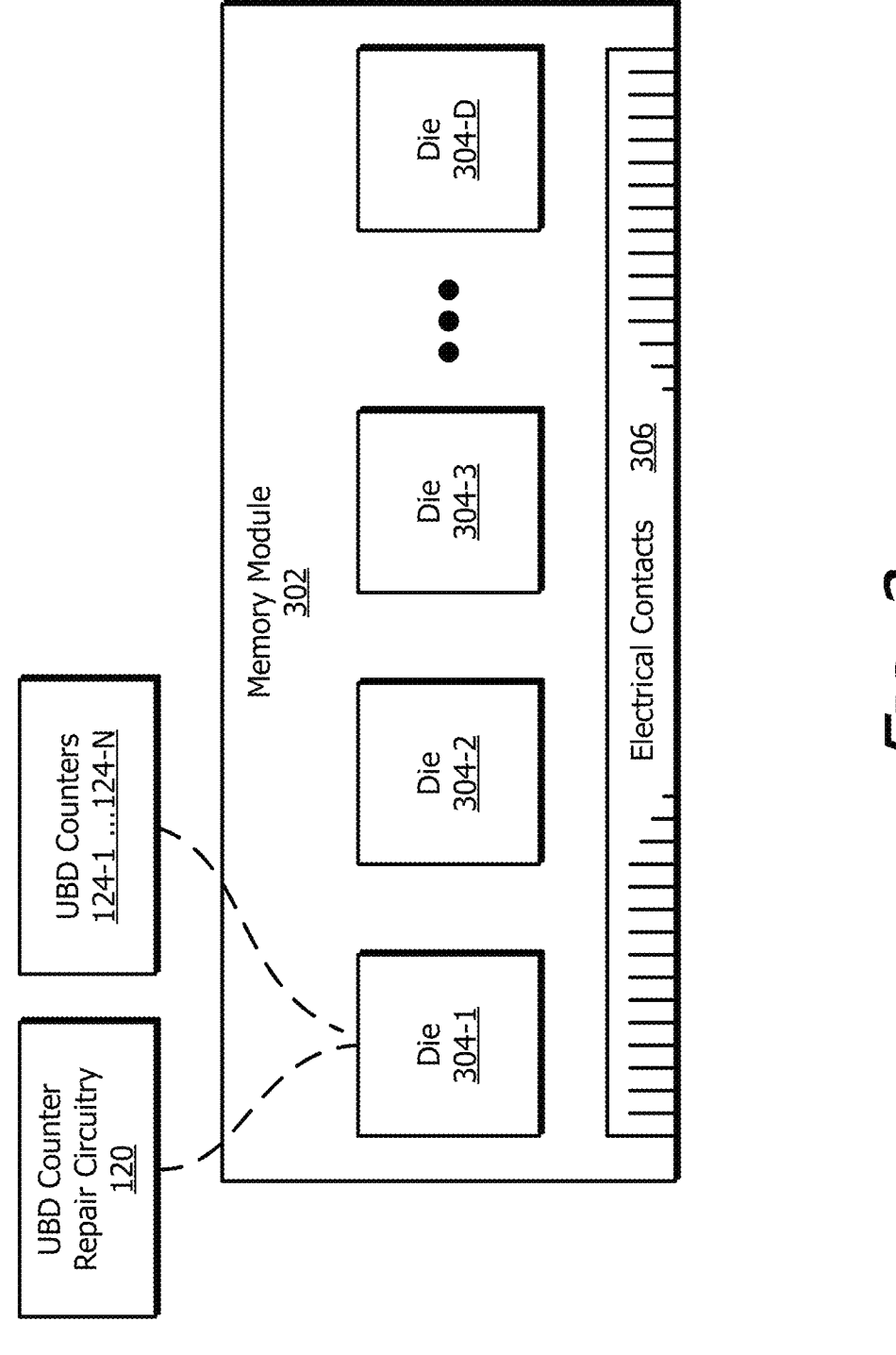
FIG. 3 illustrates an example memory device in which aspects of usage-based disturbance counter repair may be implemented.

FIG. 3 illustrates an example memory device 108 in which aspects of usage-based disturbance counter repair can be implemented. The memory device 108 includes a memory module 302, which can include multiple dies 304. As illustrated, the memory module 302 includes a first die 304-1, a second die 304-2, a third die 304-3, and a Dth die 304-D, with D representing a positive integer. One or more of the dies 304-1 to 304-D can include at least one instance of UBD counter repair circuitry 120 and multiple UBD counters 124-1 . . . 124-N. The memory module 302 can be a SIMM or a DIMM. As another example, the memory module 302 can interface with other components via a bus interconnect (e.g., a Peripheral Component Interconnect Express (PCIe®) bus). The memory device 108 illustrated in FIGS. 1 and 2 can correspond, for example, to any one or more of the multiple dies (or dice) 304-1 through 304-D or to a memory module 302 having two or more dies 304. As shown, the memory module 302 can include one or more electrical contacts 306 (e.g., pins) to interface the memory module 302 to other components.

The memory module 302 can be implemented in various manners. For example, the memory module 302 may include a printed circuit board, and the multiple dies 304-1 through 304-D may be mounted or otherwise attached to the printed circuit board. The dies 304 (e.g., memory dies) may be arranged in a line or along two or more dimensions (e.g., forming a grid or array). The dies 304 may have a similar size or may have different sizes. Each die 304 may be similar to another die 304 or different in size, shape, data capacity, or control circuitries. The dies 304 may also be positioned on a single side or on multiple sides of the memory module 302. Example aspects of the UBD counter repair circuitry 120 and the multiple UBD counters 124-1 . . . 124-N are described below with respect to FIG. 4. In some cases, the memory module 302 may be part of a CXL memory system or module.

Generally, a memory device such as the ones described herein can be secured to a printed circuit board (PCB), such as a rigid or flexible motherboard. The printed circuit board can include sockets for receiving at least one processor and one or more memory devices. Wiring infrastructure can be disposed on at least one layer of the printed circuit board, enabling communication between two or more components. Some printed circuit boards include multiple sockets that are each shaped as a linear slot designed to accept a dual in-line memory module (DIMM) (e.g., a memory device). These sockets can be fully occupied by dual in-line memory modules while a processor is still able to utilize additional memory. In such situations, the system is capable of greater performance if additional memory is available to the processor.

Printed circuit boards may also include at least one peripheral component interconnect express (PCIe®) slot. A PCIe slot is designed to provide a common interface for various types of components that may be coupled to a PCB. The PCIe protocol can provide higher rates of data transfer, smaller footprints, or both to the PCB compared to some other standards. Accordingly, certain PCBs enable a processor to access a memory device that is connected to the PCB via a PCIe slot.

In some implementations, accessing a memory solely using a PCIe protocol may not offer a desired functionality or reliability. In such implementations, another protocol may be layered on top of the PCIe protocol. As an example, one higher-level protocol is the Compute Express Link™ (CXL™) protocol, such as versions 1.0/1.1/1.x, 2.0, 3.0, and future versions. The CXL protocol can be implemented over a physical layer that is governed by, for example, the PCIe protocol. The CXL protocol can provide a memory-coherent interface capable of high-bandwidth or low-latency data transfers or data transfers with both conditions.

The CXL protocol addresses some of the limitations of PCIe links by providing an interface that leverages, for example, the PCIe 5.0 physical layer while providing lower-latency paths for memory access and coherent caching between processors and memory devices. The CXL protocol can offer high-bandwidth, low-latency connectivity between a host device (e.g., at least one processor, one or more central processing units (CPUs), at least one system-on-a-chip (SoC)) and memory devices (e.g., dual in-line memory modules, accelerators, memory expanders). The CXL protocol also addresses growing high-performance computational workloads by supporting diverse processing and memory systems with potential applications in AI, machine learning (ML), advanced driver assistance systems (ADAS), and other high-performance computing environments. Thus, in addition to or instead of a single in-line memory module (SIMM) or a dual in-line memory module (DIMM), a memory device 108 and/or a memory module 302 can also include a CXL memory module.

FIG. 4 illustrates a schematic diagram of an example memory device 108 that includes usage-based disturbance counter repair circuitry 120 and multiple usage-based disturbance counters 124-1 . . . 124-N. As shown, the memory device 108 also includes an interface 206 and UBD counter operational circuitry 410. The memory device 108 is depicted to include multiple memory rows 402-1 . . . 402-N (or multiple rows 402-1 . . . 402-N) forming at least part of a memory array 204, with N representing a positive integer. Thus, a quantity of multiple UBD counters 124-1 . . . 124-N may equal a quantity of multiple memory rows 402-1 . . . 402-N; however, the quantity of UBD counters may instead be different from the quantity of memory rows. Each respective memory row 402-x of the multiple memory rows 402-1, 402-2, . . . , 402-N can correspond to a respective memory row address 404-x of multiple memory row addresses 404-1, 404-2, . . . , 404-N.

In example implementations, the memory device 108 includes logic 412 that is coupled at least to the interface 206, the memory array 204, and/or the multiple UBD counters 124-1 . . . 124-N. The logic 412 can include the UBD counter repair circuitry 120 or the UBD counter operational circuitry 410, including each or both in accordance with a permitted herein, but optional, inclusive-or interpretation of the word "or." Although illustrated as separate blocks, the UBD counter repair circuitry 120 and the UBD counter operational circuitry 410 may be at least partially integrated into joint circuitry (e.g., usage-based disturbance counter circuitry), may have overlapping circuitry that is shared, and so forth. For example, a logical unit that updates (e.g., increments or clears) a spare UBD counter 122 or a UBD counter 124 may be used in common by the UBD counter repair circuitry 120 and the UBD counter operational circuitry 410. A counter value update unit 704, for instance, is described below with reference to FIG. 7, and the counter value update unit 704 may be used for UBD counter repair operations and for "regular" UBD counter operations.

Generally, the multiple usage-based disturbance counters 124-1 . . . 124-N can be associated with the memory array 204. In some cases, each respective usage-based disturbance counter 124-x of the multiple usage-based disturbance counters 124-1, 124-2, . . . , 124-N can correspond to a respective memory row 402-x of the multiple memory rows 402-1, 402-2, . . . , 402-N of the memory array 204. A given usage-based disturbance counter 124-x can store a counter value (or value) indicative of a quantity of activations (e.g., accesses) to the corresponding memory row 402-x. There may be a one-to-one correspondence between each UBD counter 124 and each memory row 402 across at least a portion of the memory array 204. Alternatively, one UBD counter 124 may correspond to multiple memory rows to reduce a total quantity of UBD counters in exchange for additional mitigation procedure overhead.

In some cases, the multiple usage-based disturbance counters 124-1 . . . 124-N can be integrated with the memory array 204. In some aspects, such integration can relate to being disposed within or adjacent to the memory array 204, to being part of a same collapsible power domain, to sharing access circuitry (e.g., a set of sense amplifiers or a write driver), to being associated with a same memory bank, to sharing common word lines, some combination thereof, and so forth. In other cases, the multiple UBD counters 124-1 . . . 124-N can be disposed apart from the multiple memory rows 402-1 . . . 402-N or separately from the memory array 204. For example, the multiple UBD counters 124-1 . . . 124-N can be part of the control circuitry 208 (of FIG. 2) and/or be disposed along a periphery of an integrated circuit.

In example operations for handling usage-based disturbance effects, the UBD counter operational circuitry 410 can update a respective UBD counter 124-x in response to an activation of (e.g., an access to read from or write to) the corresponding respective memory row 402-x in order to track activations. For example, in response to a read or write operation to a memory row 402, the UBD counter operational circuitry 410 can increment a counter value stored in the corresponding UBD counter 124. Further, as time elapses and the counter value increases, if the counter value eventually meets (e.g., is equal to or exceeds) at least one threshold value, the UBD counter operational circuitry 410 can perform at least one mitigation procedure on one or more affected memory rows based on the tracked activations as reflected by the counter value. For instance, the UBD counter operational circuitry 410 can activate one or more proximate, including adjacent, memory rows of the memory row 402 that corresponds to the counter value that meets the threshold. As part of such a mitigation procedure, the UBD counter operational circuitry 410 can activate one or more affected memory rows for the purpose of returning or reinstating the correct memory states to their "full" corresponding voltage levels, whether the "full" voltage level be high, low, or other.

In response to performing the mitigation procedure for at least one affected memory row 402, the UBD counter operational circuitry 410 can clear the corresponding UBD counter 124. For example, the UBD counter operational circuitry 410 can clear the UBD counter 124 by writing a known value into the UBD counter 124. This known value can be a constant or another determinable value. For instance, the UBD counter operational circuitry 410 can clear the UBD counter 124 by writing a zero ("0") into each bit of multiple bits of the UBD counter 124. As described below, the UBD counter repair circuitry 120 can analogously clear the spare UBD counter 122 in response to at least one mitigation procedure.

In example implementations, the UBD counter repair circuitry 120 can include at least one spare UBD counter 122, one or more mode registers 406, and at least one register 408. The spare UBD counter 122 can replace, or be substituted for, a faulty UBD counter 124-f of the multiple UBD counters 124-1 . . . 124-N. Assume that a UBD counter 124-f is determined to be faulty by the memory device 108 or a host device 104, such as by a memory controller 114 thereof. In some cases, a UBD counter 124 may be determined to be faulty, for example, if the UBD counter 124 fails to reset to an initial value in response to a reset command, or if the UBD counter 124 fails to track accesses correctly (e.g., 10 commands to increment the counter value thereof do not produce a counter value that has increased by 10). Instead of using the faulty UBD counter 124-f to track activations of the memory row 402-f corresponding to the faulty UBD counter 124-f, the UBD counter repair circuitry 120 uses the spare UBD counter 122 to track such activations.

Thus, the UBD counter repair circuitry 120 can increment a counter value 414 (or value 414) stored in the spare UBD counter 122 responsive to an activation of (e.g., a memory read or write access to) the corresponding memory row 402-f that corresponds to a memory row address 404-f. As indicated by the "x mark," the UBD counter 124-f is faulty in this scenario. The corresponding memory row 402-f, however, may remain functional and not need to be repaired as indicated by the "check mark" associated therewith. A repair procedure, in which a spare UBD counter 122 is activated to be used in lieu of a faulty UBD counter 124-*f*, can be instigated and/or controlled by the memory device 108 or a host device 104 that is coupled thereto. Accordingly, in some environments, the memory device 108 may detect that a UBD counter 124 is faulty and then automatically repair the faulty UBD counter 124-*f* using a repair procedure that replaces the faulty one with a spare UBD counter 122 without control or oversight by a memory controller or host device.

With respect to handling usage-based disturbance effects, the UBD counter repair circuitry 120, in conjunction with the UBD counter operational circuitry 410 in some aspects, can perform at least one mitigation procedure responsive to the counter value 414 in the spare UBD counter 122 meeting (e.g., equaling or exceeding) at least one threshold value. For example, the UBD counter operational circuitry 410 can activate one or more proximate, including adjacent, memory rows of the memory row 402-*f* that corresponds to the counter value 414 in the spare UBD counter 122 that meets the threshold. These proximate rows may include, for instance, memory rows 402-(*f*–2), 402-(*f*–1), 402-(*f*+1), and 402-(*f*+2).

In response to performing the mitigation procedure(s) for the memory row(s) affected by activations of the memory row 402-*f*, the UBD counter repair circuitry 120 can clear the spare UBD counter 122 as is described above for UBD counters generally. To maintain a record or other indication of which memory row 402 the spare UBD counter 122 is tracking the activations of, the register 408 can be used. The UBD counter repair circuitry 120 can store the memory row address 404-*f* of the memory row 402-*f* that corresponds to the faulty UBD counter 124-*f* that is being repaired in a volatile, or soft, counter-focused manner as described herein.

Although a single spare UBD counter 122 and corresponding register 408 are depicted in FIG. 4. The UBD counter repair circuitry 120 can include multiple spare UBD counter and register pairs. These one or more spare UBD counter and register pairs may be implemented per-chip, per-bank-group, per-bank, and so forth. If multiple such pairs are included—e.g., for a given memory bank, multiple faulty UBD counters 124 within a single memory bank can be in a soft repaired state simultaneously. On the other hand, if a single spare UBD counter and register pair is deployed instead, then a first repair may block repairs of future faulty UBD counters. Alternatively, a first repair can be replaced by a second or subsequent repair if another UBD counter (or counters) is (or are) determined to be faulty. In this latter case in which a subsequent repair "automatically" replaces a previous repair, a check for resource availability can be obviated for new soft counter-focused repairs.

In some implementations, to institute a new soft, counter-focused repair, UBD counter repair circuitry 120 can clear the spare UBD counter 122 to prepare for the new repair. The UBD counter repair circuitry 120 can also store in the register 408 the memory row address 404-*f* corresponding to the target memory row 402-*f*, which corresponds to the faulty UBD counter 124-*f*. Here, the "target" memory row 402-*f* is the memory row 402 that corresponds to the faulty UBD counter 124-*f*. The UBD counter repair circuitry 120 can further mitigate one or more memory rows that may be affected by activations of the target row.

The mode registers 406 can be used to control, at least partially, UBD counter repair from an internal perspective and/or an external perspective. In some cases, the UBD counter repair circuitry 120 of the memory device 108 can set or clear one or more bits in the mode registers 406 to support or control usage-based disturbance counter repair. In other cases, the UBD counter repair circuitry 118 (e.g., as shown in FIGS. 1 and 6) of a host device 104 can set or clear one or more bits in the mode registers 406 to support or control usage-based disturbance counter repair. Generally, the mode registers 406 can be used to facilitate communication between the memory device 108 and the host device 104 for usage-based disturbance counter repair. Example communications between UBD counter repair circuitry 118 of a host device 104 and UBD counter repair circuitry 120 of a memory device 108 are described below with reference to FIG. 6. Next, however, example implementations for one or more mode registers 406 are described with reference to FIG. 5.

Figure 5:
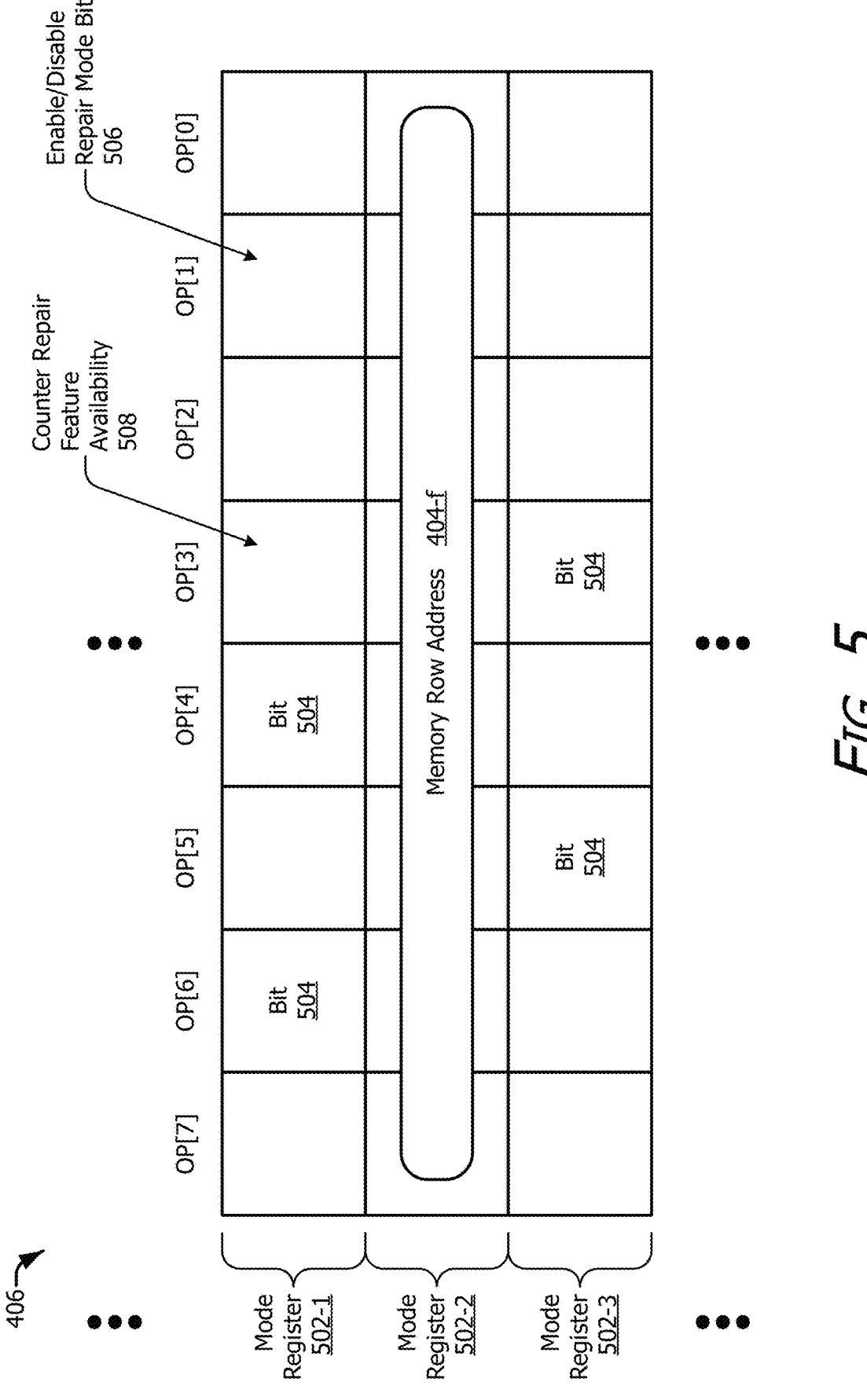
FIG. 5 illustrates a schematic diagram of example implementations of one or more mode registers that can be employed in conjunction with usage-based disturbance counter repair.
Figure 6:
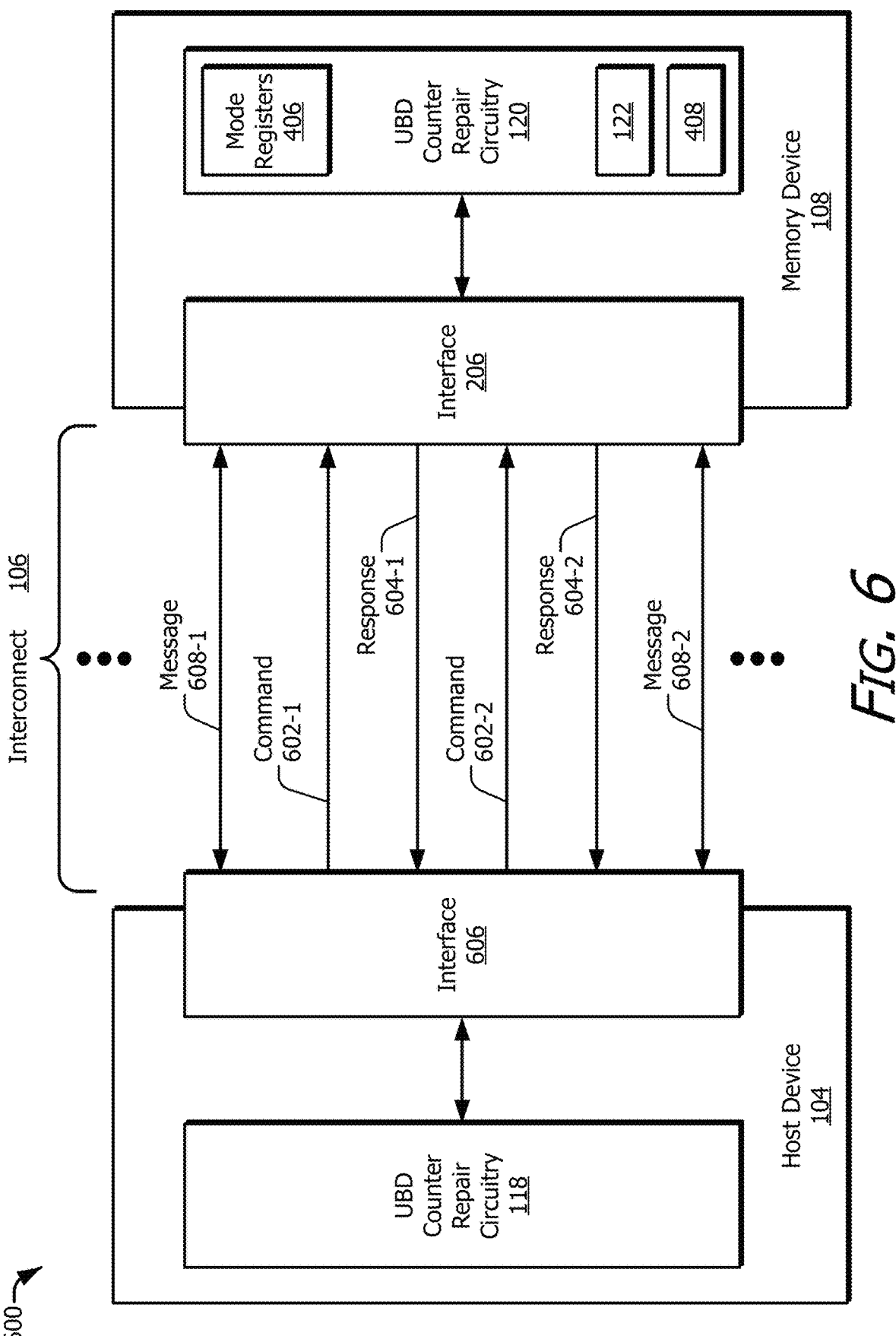
FIG. 6 illustrates a schematic diagram of example communication schemes between a host device and a memory device for usage-based disturbance counter repair.

FIG. 5 illustrates a schematic diagram of example implementations of one or more mode registers 406 that can be employed in conjunction with usage-based disturbance counter repair. As illustrated, the mode registers 406, or set of mode registers 406, include a first mode register 502-1, a second mode register 502-2, a third mode register 502-3, and so forth. Each mode register 502 is shown to include multiple bits, such as a bit 504. Specifically, each mode register 502 is depicted to include eight bits, which are marked as operands OP[7] . . . OP[0]. The one or more mode registers 406 can, however, include more or fewer than three mode registers 502-1 to 502-3, including as few as a single mode register. Each mode register 502 can include more or fewer bits (or operands) than eight, including a single bit (or operand). Further, a given mode register 502 may have a different quantity of bits than another mode register 502.

In example implementations for usage-based disturbance counter repair, at least one mode register 502 (e.g., the first mode register 502-1) can include at least one bit 504 that enables or disables a repair mode (e.g., an enable/disable bit 506). For instance, one bit value of the enable/disable bit 506 can cause the memory device 108 to enter a counter repair mode, and another bit value can cause the memory device 108 to exit the counter repair mode. Alternatively or additionally, the same bit 506 or a different bit can indicate if the memory device 108 is in the counter repair mode or not in the counter repair mode. Another bit 504 can indicate to a host device if a counter repair feature is available in a given memory device or a current configuration thereof, such as a counter repair feature availability bit 508.

In some cases, UBD counter repair circuitry 120 can write or store a memory row address 404-*f* to the register 408 (e.g., of FIGS. 4, 6, and 7) based on the enable/disable counter repair mode bit 506 having a specified value. The UBD counter repair circuitry 120 may be prevented, however, from changing the memory row address 404-*f* stored in the register 408 if that counter repair mode bit 506 has a different value.

Further, at least one mode register 502 (e.g., the second mode register 502-2) can include multiple bits (e.g., fewer than all bits or up to all bits in the mode register 502-2) that store a memory row address 404-*f* for usage-based disturbance counter repair. The memory row address 404-*f* can correspond to a memory row 402-*f* that corresponds to a faulty UBD counter 124-*f* that is targeted for repair. For instance, for a memory row address 404 that consumes eight bits, the eight operands OP[7:0] of an example mode register 502 can store the eight bits of the memory row address 404. In other instances, fewer than eight bits may be used to store the memory row address 404. Further, two or more mode registers 502 may be used to store the memory row address 404, including in—but not limited to—instances in which the memory row address 404 has more than the quantity of bits available in a single mode register 502.

In some aspects, a memory row address 404 can include bits indicating a chip identifier, a bank group, a bank, etc. to identify the corresponding memory row 402 using the memory row address 404 alone. In other aspects, the memory row address 404 may include bits that identify a memory row 402 within a particular memory bank, but another part of the address may specify a chip identifier, a bank group, a bank, and so forth. Further, other permutations may be employed, such as the memory row address 404 including bank bits but not bank group or chip select bits.

In some cases, the UBD counter repair circuitry 118 of a host device 104 may store the memory row address 404-$f$ in the second mode register 502-2 to instruct the UBD counter repair circuitry 120 of a memory device 108 of a memory row 402-$f$ that corresponds to a faulty UBD counter 124-$f$ that is to be or may be targeted for repair. This can occur, for instance, based on the UBD counter repair circuitry 118 detecting that a UBD counter 124 is faulty. In other cases, the UBD counter repair circuitry 120 of the memory device 108 may store the memory row address 404-$f$ in the second mode register 502-2 to inform the UBD counter repair circuitry 118 of the host device 104 of a memory row 402-$f$ that corresponds to a faulty UBD counter 124-$f$ that is to be or may be targeted for repair. This can occur, for instance, based on the UBD counter repair circuitry 120 detecting that a UBD counter 124 is faulty. At least one bit of at least one mode register 502 can be used in other manners to support usage-based disturbance counter repair as described herein.

FIG. 6 illustrates a schematic diagram of example communication schemes 600 between a host device 104 and a memory device 108 for usage-based disturbance counter repair. As shown, a host device 104 includes UBD counter repair circuitry 118 and an interface 606 that is coupled to the UBD counter repair circuitry 118. A memory device 108 includes UBD counter repair circuitry 120 and an interface 206 that is coupled to the UBD counter repair circuitry 120. The interface 606 and the interface 206 can be coupled to an interconnect 106. The interface 606 of the host device 104 may be configured to be coupled to the memory device 108 via the interconnect 106; similarly, the interface 206 of the memory device 108 may be configured to be coupled to the host device 104 via the interconnect 106. Thus, the UBD counter repair circuitry 118 and the UBD counter repair circuitry 120 can exchange communications with each other over the interconnect 106. These example actions, communications, and other operations may be implemented differently by way of sequence, omission, combination, and so forth in accordance with the circuitry or programming of a host device and/or a memory device.

In example implementations, these communications may include at least one command 602, at least one response 604, and/or at least one message 608. For example, the UBD counter repair circuitry 118 can transmit a first command 602-1 to the UBD counter repair circuitry 120 via the interface 606, the interconnect 106, and the interface 206. The UBD counter repair circuitry 120 can receive the first command 602-1 and perform at least one operation based on the first command 602-1. For instance, the UBD counter repair circuitry 120 may change at least one bit of the mode registers 406 or a memory row address 404-$f$ stored in the register 408. In some cases, the UBD counter repair circuitry 120 can transmit a first response 604-1 to the UBD counter repair circuitry 118 responsive to the first command 602-1 via the interface 206, the interconnect 106, and the interface 606. The first response 604-1 may pertain to a confirmation or an acknowledgement of the first command 602-1 or may include data that is requested, such as an indication of a feature availability or a status (e.g., a bit value of at least one bit 504 of at least one mode register 502) or an address (e.g., a memory row address 404). The UBD counter repair circuitry 118 can receive the first response 604-1.

The UBD counter repair circuitry 118 can also transmit a second command 602-2 to the UBD counter repair circuitry 120 via the interface 606, the interconnect 106, and the interface 206. The UBD counter repair circuitry 120 can perform at least one operation based on the second command 602-2. For instance, the UBD counter repair circuitry 120 may change at least one bit of the mode registers 406 or a memory row address 404-$f$ stored in the register 408. Additionally or alternatively, the UBD counter repair circuitry 120 can perform one or more mitigation procedures to counteract UBD effects. In some cases, the UBD counter repair circuitry 120 can transmit a second response 604-2 to the UBD counter repair circuitry 118 responsive to the second command 602-2. The second response 604-2 may pertain to a confirmation or an acknowledgement or may include requested data.

Additionally or alternatively, the host device 104 and the memory device 108 can exchange one or more messages 608. For example, the UBD counter repair circuitry 120 can transmit a first message 608-1 to the UBD counter repair circuitry 118, and the UBD counter repair circuitry 118 can receive the first message 608-1 from the UBD counter repair circuitry 120, or vice versa. Also, the UBD counter repair circuitry 118 can transmit a second message 608-2 to the UBD counter repair circuitry 120, and the UBD counter repair circuitry 120 can receive the second message 608-2 from the UBD counter repair circuitry 118, or vice versa. Such messages 608 can comprise commands, status reports, instructions, mode register values, a memory row address 404-$f$ of a memory row 402-$f$ corresponding to a faulty UBD counter 124-$f$, and so forth.

In some aspects for the memory device 108, the usage-based disturbance counter repair circuitry 120 can store in a register 408 a memory row address 404-$f$ of multiple memory row addresses 404-1 . . . 404-N responsive to at least one of the first command 602-1 or the second command 602-2. Here, the memory row address 404-$f$ can correspond to a memory row 402-$f$ that corresponds to a faulty usage-based disturbance counter 124-$f$. Responsive to an activation of the memory row 402-$f$ corresponding to the memory row address 404-$f$ stored in the register 408, the UBD counter repair circuitry 120 can increment the spare usage-based disturbance counter 122—e.g., can increase by one a counter value 414 stored therein. In other aspects for the memory device 108, the usage-based disturbance counter repair circuitry 120 can write at least one bit 506 in at least one mode register 406 (e.g., a first mode register 502-1) to enter a repair mode enabling a volatile repair of a faulty usage-based disturbance counter 124-$f$ responsive to at least the first command 602-1.

In some aspects for the host device 104, the usage-based disturbance counter repair circuitry 118 can transmit to the memory device 108 the first command 602-1 to initiate repairing of a faulty usage-based disturbance counter 124-$f$. In at least some of such cases, the usage-based disturbance counter repair circuitry 118 can transmit to the memory device 108 the first command 602-1 to write at least one bit 506 in at least one mode register 406 (e.g., a first mode register 502-1) to enter a repair mode for the faulty usage-based disturbance counter 124-*f*.

Further, the usage-based disturbance counter repair circuitry 118 of the host device 104 can transmit to the memory device 108 the second command 602-2 to write to the at least one bit 506 in the at least one mode register 406 to exit the repair mode for the faulty usage-based disturbance counter 124-*f*. Alternatively, the usage-based disturbance counter repair circuitry 118 can transmit to the memory device 108 the second command 602-2 including at least an indication of a memory row address 404-*f* to be assigned to the spare usage-based disturbance counter 122.

The commands 602, responses 604, and messages 608 of FIG. 6 can be implemented in other manners. Examples of other manners are described next with respect to an example counter-focused soft UBD counter repair procedure controlled at least partially by a host device 104. As used herein, a counter-focused repair procedure for a faulty UBD counter 124-*f* can refer to a repair procedure in which a counter is faulty and is being replaced, but the corresponding memory row 402-*f* is not faulty and is not being replaced. Accordingly, data for the memory address 404-*f* continues to be stored in the memory row 402-*f* in the memory array 204, instead of somewhere in a spare memory row.

A counter-focused sPPR usage-based disturbance counter repair procedure as described herein may be implemented in a similar or analogous manner as compared to an sPPR or hPPR procedure that replaces a combined usage-based disturbance counter and memory row with a spare combined UBD counter and memory row. Nonetheless, mode register bits on the memory device 108 may be different for the two sPPR procedures and/or for each of the sPPR procedures and the hPPR procedure. With a counter-focused sPPR usage-based disturbance counter repair procedure, the data in the memory row 402 need not be backed up or transferred to a different location. The data bits can remain at the targeted memory row. Thus, future write and read operations can still be directed to the original memory row 402 in the memory array 204.

Further, in some cases, neither the host device 104 nor the memory device 108 need perform a check for resource availability. Instead, the same spare UBD counter 122 resource (or set of finite spare UBD counters 122) can be used for a new repair, which may automatically cancels a previous repair. A different minimum sPPR programming time (tPGM_sPPR(min)), or an extra waiting time after the row pre-charge time (tRP), can be enacted to allow the memory device 108 to perform an internal mitigation of the affected memory row(s) of the target memory row.

By way of example but not limitation, one or more aspects of the following operations can be performed to implement a usage-based disturbance counter-focused sPPR procedure. Thus, these example actions, communications, and other operations may be implemented differently by way of order, omission, combination, and so forth as per the circuitry or programming of a host device and/or a memory device. First, before entering a counter repair mode, all relevant banks can be in a precharged and idle state at the memory device. The CRC mode can be disabled. Second, the counter repair mode can be entered using a write to a mode register, which may be commanded by a host device, and waiting a mode register delay time (tMRD). The host device can then issue a Guard Key as four consecutive mode register write (MRW) commands, each with a unique address field OP[7: 0]. Each MRW command may be separated by the tMRD. The Guard Key sequence can be the same as for other PPR procedures or different.

The host device next issues an activation (ACT) command with chip identification (CID) bits, bank group bits, bank bits, and memory row address corresponding to the faulty UBD counter. Write data can be used to select an individual DRAM in a rank for repair. For non-3DS DRAMs, the CID bits need only be Valid, for they can be ignored by the DRAM. The host device issues a write (WR) command after an RAS-to-CAS delay time (tRCD) with a valid column address; however, the DRAM may ignore the column address given with the WR command.

After the word line (WL) address is provided (WL=WL=RL−2), one or more bits (e.g., DQ[3:0]) of the individual targeted DRAM can be driven to a specified level, such as LOW, for eight clock cycles (8tCK). If more than one DRAM shares the same command bus, DRAMs that are not being repaired may be so informed by having these data bits (e.g., DQ[3:0]) driven to another specified level, such as HIGH, for 8tCK. If all of the relevant lines (e.g., the DQ[3:0] data bits) are neither all LOW nor all HIGH for 8tCK, then the sPPR mode may be deemed to be unknown. For x8 and x16 devices, other data bits (e.g., those other than DQ[3:0]) can be "don't cares."

After waiting tPGM_sPPR(min) for the internal repair register to be written, the host device can issue a precharge (PRE) command to the bank. The host device waits tRP after the PRE command to allow the DRAM to recognize the memory row address of the repaired corresponding UBD counter. The host device can then issue a refresh management (RFM) command and wait tRFM to allow the memory device to perform one or more internal mitigations to counteract UBD effects. To disable the counter repair mode, the host device can command the memory device to exit the counter-focused sPPR repair mode using an MRX command and waiting tMRD.

In some implementations, if a greater quantity of counter-focused sPPR requests are made to a given repair region than the repair region has pairs of spare UBD counters and registers (e.g., if more than one counter-focused sPPR request is made to a given repair region having a single counter-register pair), the most-recently issued memory row address for a repair can replace an earlier-issued memory row address within the given repair region (e.g., bank and set of row addresses). In a scenario for conducting soft, counter-focused repairs for addresses in different repair regions, the host device can repeat the operations described above from (i) the issuing of an ACT command to (ii) the issuing of an RFM command, which may be to provide the memory device time to conduct one or more internal mitigations. During a soft counter-focused repair, implementing a refresh or RFM command for an actual row refreshing may be disallowed between the counter-focused repair mode entry and exit.

Figure 7:
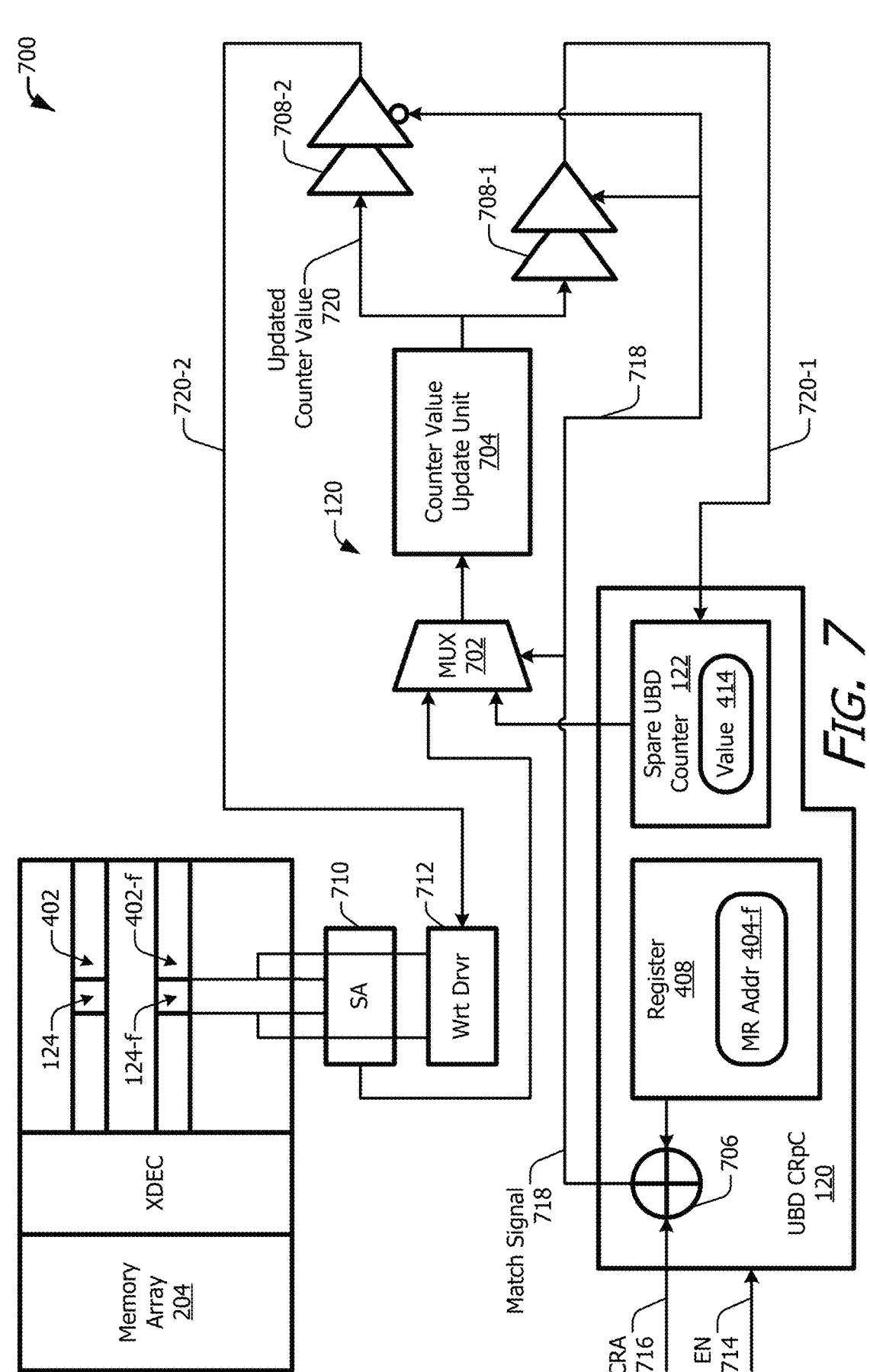
FIG. 7 illustrates a schematic diagram of example usage-based disturbance counter repair circuitry in conjunction with example circuitries and operations relating to a memory array.

FIG. 7 illustrates a schematic diagram 700 of example usage-based disturbance counter repair circuitry 120 in conjunction with example circuitries and operations relating to a memory array 204. The memory array 204 includes at least one memory bank having multiple memory rows, such as a memory row 402. A particular memory row 402 can be selected for activation using a row decoder (XDEC). In this example for FIG. 7, a UBD counter 124 for the memory row 402 is "embedded" or integrated with the memory array 204 such that the UBD counter 124 and the memory row 402 form a combination row in the memory array 204. For instance, each respective usage-based disturbance counter 124 and each respective memory row 402 may form a respective combined memory row including data bits for the respective memory row 402 and counter bits for the respective usage-based disturbance counter 124. The principles described with reference to FIG. 7 are applicable, however, to other placements or architectures for multiple UBD counters 124-1 . . . 124-N (e.g., of FIG. 4).

In example implementations, the UBD counter repair circuitry 120 can include at least one spare UBD counter 122, at least one register 408, at least one multiplexer 702 (MUX 702), at least one counter value update unit 704, and at least one comparison unit 706. The UBD counter repair circuitry 120 can also include one or more buffers, such as a first buffer 708-1 and a second buffer 708-2. One or more of these components, such as the counter value update unit 704 or the second buffer 708-2, can instead or additionally be part of UBD counter operational circuitry 410 (of FIG. 4). The memory device can also include sense amplifiers 710 (SA 710) and a write driver 712 (Wrt Drvr 712). The sense amplifiers 710 and/or the write driver 712 can be dedicated to accessing the multiple UBD counters 124-1 . . . 124-N or may also be capable of accessing other memory storage cells, such as those of the memory row 402.

In example operations, the UBD counter repair circuitry 120 can be enabled via an enable signal 714 (EN 714). The enable signal 714 can be derived from, for instance, at least one bit of a mode register 406 (of FIGS. 4 and 5), such as the enable/disable repair mode bit 506 (of FIG. 5). The enable signal 714 can be active to allow the UBD counter repair circuitry 120 to operate generally or to permit the UBD counter repair circuitry 120 to perform a new soft, counter-focused repair procedure (e.g., permitted to store a new memory row address 404-f in the register 408). Further, the enable signal 714 may comprise multiple enable signals that indicate multiple such types or levels of authorizations.

The UBD counter repair circuitry 120 can receive a current memory row address 716 (CRA 716) for a current memory operation for a memory row 402 or 402-f. The comparison unit 706 can compare the current memory row address 716 to the memory row address 404-f stored in the register 408. The result is a match signal 718. In a first scenario, consider that the match signal 718 is an affirmative match signal (e.g., that the two memory row addresses are equal). The affirmative match signal 718 can select the lower input (as depicted) of the multiplexer 702. The lower input may accept the value 414 that is currently stored in the spare UBD counter 122. The counter value update unit 704 can update the counter value 414 by incrementing the value by one (+1). The counter value update unit 704 can output an updated counter value 720 to the first and second buffers 708-1 and 708-2.

The affirmative match signal 718 can select for forwarding an output from the first buffer 708-1. The first buffer 708-1 can provide the updated counter value 720-1 to the spare UBD counter 122 as a "new" counter value 414. In these manners, the spare UBD counter 122 can track activations for the memory row 402-f corresponding to the memory row address 404-f stored in the register 408 as a volatile, or soft, repair of a faulty UBD counter 124-f that corresponds to the memory row 402-f and the memory row address 404-f. Reads and writes to the memory row 402-f can still be directed to the memory array 204.

In a second scenario, the comparison unit 706 compares another current memory row address 716 for another current memory operation to the memory row address 404-f stored in the register 408. The result in this second scenario is a match signal 718 that is negative (e.g., that the two memory row addresses are unequal). The negative match signal 718 can select the upper input (as depicted) of the multiplexer 702. The upper input may accept a counter value from the (non-faulty) UBD counter 124 as sensed by the sense amplifiers 710. The counter value update unit 704 can update this counter value by incrementing the value by one (+1). The counter value update unit 704 can output this updated counter value 720 to the first and second buffers 708-1 and 708-2.

The negative match signal 718 selects for forwarding an output from the second buffer 708-2, as indicated by the inverting circle input to the second buffer 708-2. The second buffer 708-2 can provide the updated counter value 720-2 to the write driver 712. The write driver 712 can write the updated counter value 720-2 to the UBD counter 124 corresponding to the current row address 716, which corresponds to the memory row 402. In these manners, the UBD counter circuitry (e.g., the UBD counter repair circuitry 120 and/or the UBD counter operational circuitry 410) can track activations of memory rows 402 that are associated with non-faulty UBD counters 124.

Example Methods

This subsection describes example methods for implementing usage-based disturbance counter repair with reference to the flow diagrams of FIGS. 8 and 9. These descriptions may also refer to components, entities, and other aspects depicted in FIGS. 1 to 7, but by way of example only. The described methods are not necessarily limited to performance by one entity or multiple entities operating on one device. In particular, but by way of example only, the description of FIG. 6 provides multiple examples for one or more commands, responses, messages, and so forth.

FIG. 8 illustrates a flow diagram 800, which includes operations 802 and 804, for implementing aspects of usage-based disturbance counter repair for a host device 104. In aspects, operations of the method 800 can be implemented by UBD counter repair circuitry 118 in conjunction with an interface 606 as described with reference to FIGS. 1 to 7.

At block 802, a first command is transmitted to the memory device, with the first command relating to repairing a faulty usage-based disturbance counter using a spare usage-based disturbance counter that is configured to be assignable to multiple memory row addresses. For example, the host device 104 can transmit to a memory device 108 a first command 602-1 that relates to repairing a faulty usage-based disturbance counter 124-f using a spare usage-based disturbance counter 122 that is configured to be assignable to multiple memory row addresses, such as any of multiple memory row addresses 404-1 . . . 404-N, including a memory row address 404-f. For instance, the UBD counter repair circuitry 118 may transmit a mode register write (MRW) command for an enable/disable repair mode bit 506 of one or more mode registers 406 to indicate entry to a repair mode.

The enable/disable repair mode bit 506 may relate to a repair capability for multiple usage-based disturbance counters 124-1 . . . 124-N at the memory device 108, with the repair capability pertaining to a spare usage-based disturbance counter 122 that is configured to be assignable to correspond to different memory row addresses of the multiple memory row addresses 404-1 . . . 404-N. Here, the spare UBD counter 122 may be assignable if the spare UBD counter 122 can correspond to at least one memory row address 404 that is capable of being changed during operation, that is assignable sequentially to different memory row addresses, that is re-assignable from one memory row address to another memory address, and so forth.

At block 804, a second command is transmitted to the memory device, with the second command relating to the repairing of the faulty usage-based disturbance counter using the spare usage-based disturbance counter. For example, the host device 104 can transmit to the memory device 108 a second command 602-2 that relates to the repairing of the faulty usage-based disturbance counter 124-*f* using the spare usage-based disturbance counter 122. In some cases, the second command 602-2 may correspond to writing to the enable/disable repair mode bit 506 of a first mode register 502-1 to indicate or instruct an exiting of the repair mode. In other cases, the second command 602-2 may correspond to writing into a second mode register 502-2 a memory row address 404-*f* of a memory row 402-*f* that corresponds to a faulty UBD counter 124-*f*. The second command 602-2 may instead correspond to any of the commands, messages, etc. described above for a counter-focused sPPR procedure.

FIG. 9 illustrates a flow diagram 900, which includes operations 902 and 904, for implementing aspects of usage-based disturbance counter repair for a memory device 108. In aspects, operations of the method 900 can be implemented by UBD counter repair circuitry 120 in conjunction with an interface 206 as described with reference to FIGS. 1 to 7.

At block 902, a first command is received from the host device, with the first command relating to repairing a faulty usage-based disturbance counter using a spare usage-based disturbance counter configured to be assignable to different memory row addresses of multiple memory row addresses. For example, the memory device 108 can receive from a host device 104 a first command 602-1 that relates to repairing a faulty usage-based disturbance counter 124-*f* using a spare usage-based disturbance counter 122 configured to be assignable to different memory row addresses 404-*x* of multiple memory row addresses 404-1 . . . 404-N. For instance, the UBD counter repair circuitry 120, including post-package repair (PPR) circuitry generally, can receive a command to write a particular value to an enable/disable repair mode bit 506 of one or more mode registers 406 to indicate entry into a repair mode for soft, counter-focused repairs. Alternatively, the first command 602-1 may correspond to a Key Guard sequence or a memory row address 404-*f* of a memory row 402-*f* being targeted for the counter repair procedure.

At block 904, a second command is received from the host device, with the second command relating to the repairing of the faulty usage-based disturbance counter using the spare usage-based disturbance counter. For example, the memory device 108 can receive from the host device 104 a second command 602-2 that relates to the repairing of the faulty usage-based disturbance counter 124-*f* using the spare usage-based disturbance counter 122. In some cases, the second command 602-2 causes the UBD counter repair circuitry 120 to write another value to the enable/disable repair mode bit 506 of a mode register 502 to indicate exit from the repair mode. Alternatively, the second command 602-2 can correspond to an activation command, a targeted memory row address, a write command, particular values on the data bus, or other signaling enabling the host device 104 to at least partially control a soft, counter-focused repair procedure at the memory device 108 as described herein.

For the figures and operations described above, the orders in which the operations are shown and/or described are not intended to be construed as a limitation. Any number or combination of the described process operations can be combined or rearranged in any order to implement a given method or an alternative method. Operations may also be omitted from or added to the described methods. Further, described operations can be implemented in fully or partially overlapping manners.

Aspects of these methods may be implemented in, for example, hardware (e.g., fixed-logic circuitry or a processor in conjunction with a memory), firmware, software, or some combination thereof. The methods may be realized using one or more of the apparatuses or components shown in FIGS. 1 to 7, the components of which may be further divided, combined, rearranged, and so on. The devices and components of these figures generally represent hardware, such as electronic devices, packaged modules, IC chips, or circuits; firmware or the actions thereof; software; or a combination thereof. Thus, these figures illustrate some of the many possible systems or apparatuses capable of implementing the described methods.

Computer-readable media includes both non-transitory computer storage media and communication media including any medium that facilitates transfer of a computer program (e.g., an application) or data from one entity to another. Non-transitory computer storage media can be any available medium accessible by a computer, such as RAM, ROM, Flash, EEPROM, optical media, and magnetic media.

In the following, various examples for implementing aspects of usage-based disturbance counter repair are described:

Example 1: An apparatus comprising:
  a memory device comprising:
    a memory array comprising multiple memory rows including a memory row corresponding to a memory row address;
    multiple usage-based disturbance counters associated with the multiple memory rows of the memory array; and
    usage-based disturbance counter repair circuitry coupled to the multiple usage-based disturbance counters, the usage-based disturbance counter repair circuitry comprising a spare usage-based disturbance counter and a register, the usage-based disturbance counter repair circuitry configured to:
      store the memory row address in the register; and
      update the spare usage-based disturbance counter responsive to an operation for the memory row corresponding to the memory row address stored in the register.

Example 2: The apparatus of example 1 or any other example, wherein the usage-based disturbance counter repair circuitry is configured to:
  compare a current memory row address for a current memory operation to the memory row address stored in the register;
  responsive to the current memory row address being equal to the memory row address stored in the register, update the spare usage-based disturbance counter; and
  responsive to the current memory row address being unequal to the memory row address stored in the register, update a usage-based disturbance counter of the multiple usage-based disturbance counters that corresponds to the current memory row address.

Example 3: The apparatus of example 1 or any other example, wherein:
  the usage-based disturbance counter repair circuitry is configured to assign different memory row addresses to the spare usage-based disturbance counter using the register; and the memory device is configured to perform the operation for the memory row on the memory row in the memory array.

Example 4: The apparatus of example 1 or any other example, wherein:

the operation for the memory row comprises an activation of the memory row corresponding to the memory row address stored in the register; and the usage-based disturbance counter repair circuitry is configured to update the spare usage-based disturbance counter by incrementing a value stored in the spare usage-based disturbance counter responsive to the activation.

Example 5: The apparatus of example 1 or any other example, wherein:

the operation for the memory row comprises at least one mitigation procedure performed on one or more memory rows affected by activations of the memory row corresponding to the memory row address stored in the register; and the usage-based disturbance counter repair circuitry is configured to update the spare usage-based disturbance counter by clearing a value stored in the spare usage-based disturbance counter responsive to the at least one mitigation procedure.

Example 6: The apparatus of example 1 or any other example, wherein the usage-based disturbance counter repair circuitry is configured to:

store another memory row address in the register in place of the memory row address, the other memory row address corresponding to another memory row of the multiple memory rows of the memory array; and clear the spare usage-based disturbance counter based on storage of the other memory row address in the register.

Example 7: The apparatus of example 6 or any other example, wherein the usage-based disturbance counter repair circuitry is configured to at least one of:

perform a mitigation procedure on one or more memory rows affected by activations of the memory row corresponding to the memory row address; or perform a mitigation procedure on one or more memory rows affected by activations of the other memory row corresponding to the other memory row address.

Example 8: The apparatus of example 1 or any other example, wherein the memory device further comprises:

one or more mode registers comprising one or more bits relating to a repair capability for the multiple usage-based disturbance counters, the repair capability pertaining to the spare usage-based disturbance counter that is configured to be assignable to correspond to different memory row addresses.

Example 9: The apparatus of example 8 or any other example, wherein the one or more bits of the one or more mode registers comprise:

at least one bit indicative of entry to or exit from a repair mode that enables the repair capability for the multiple usage-based disturbance counters using the spare usage-based disturbance counter.

Example 10: The apparatus of example 1 or any other example, wherein the memory device further comprises:

usage-based disturbance counter operational circuitry configured to:

track activations of the multiple memory rows using the multiple usage-based disturbance counters; and perform mitigation procedures on memory rows affected by the tracked activations.

Example 11: The apparatus of example 1 or any other example, wherein:

each respective usage-based disturbance counter of the multiple usage-based disturbance counters corresponds to a respective memory row of the multiple memory rows of the memory array; and each respective usage-based disturbance counter and each respective memory row form a respective combined memory row comprising data bits for the respective memory row and counter bits for the respective usage-based disturbance counter.

Example 12: The apparatus of example 1 or any other example, wherein the usage-based disturbance counter repair circuitry is configured to:

detect that a usage-based disturbance counter of the multiple usage-based disturbance counters is faulty, the usage-based disturbance counter that is faulty corresponding to the memory row that corresponds to the memory row address.

Example 13: An apparatus comprising:

a memory device comprising:

an interface configured to be coupled to a host device; and usage-based disturbance counter repair circuitry coupled to the interface and configured to:

receive from the host device a first command that relates to repairing a faulty usage-based disturbance counter using a spare usage-based disturbance counter configured to be assignable to different memory row addresses of multiple memory row addresses; and receive from the host device a second command that relates to the repairing of the faulty usage-based disturbance counter using the spare usage-based disturbance counter.

Example 14: The apparatus of example 13 or any other example, wherein the usage-based disturbance counter repair circuitry is configured to:

store in a register a memory row address of the multiple memory row addresses responsive to at least one of the first command or the second command, the memory row address corresponding to a memory row that corresponds to the faulty usage-based disturbance counter; and increment the spare usage-based disturbance counter responsive to an activation of the memory row corresponding to the memory row address stored in the register.

Example 15: The apparatus of example 13 or any other example, wherein the usage-based disturbance counter repair circuitry is configured to:

write at least one bit in at least one mode register to enter a repair mode enabling a volatile repair of the faulty usage-based disturbance counter responsive to at least the first command.

Example 16: An apparatus comprising:

a host device comprising:

an interface configured to be coupled to a memory device; and usage-based disturbance counter repair circuitry coupled to the interface and configured to:

transmit to the memory device a first command that relates to repairing a faulty usage-based disturbance counter using a spare usage-based disturbance counter that is configured to be assignable to multiple memory row addresses; and

transmit to the memory device a second command that relates to the repairing of the faulty usage-based disturbance counter using the spare usage-based disturbance counter.

Example 17: The apparatus of example 16 or any other example, wherein the usage-based disturbance counter repair circuitry is configured to:

transmit to the memory device the first command to initiate the repairing of the faulty usage-based disturbance counter.

Example 18: The apparatus of example 17 or any other example, wherein the usage-based disturbance counter repair circuitry is configured to:

transmit to the memory device the first command to write at least one bit in at least one mode register to enter a repair mode for the faulty usage-based disturbance counter.

Example 19: The apparatus of example 18 or any other example, wherein the usage-based disturbance counter repair circuitry is configured to:

transmit to the memory device the second command to write to the at least one bit in the at least one mode register to exit the repair mode for the faulty usage-based disturbance counter.

Example 20: The apparatus of example 17 or any other example, wherein the usage-based disturbance counter repair circuitry is configured to:

transmit to the memory device the second command including at least an indication of a memory row address to be assigned to the spare usage-based disturbance counter.

Example 21: The apparatus of example 12 or any other example, wherein the usage-based disturbance counter repair circuitry is configured to:

perform the storage of the memory row address in the register responsive to the detection by the memory device that the usage-based disturbance counter of the multiple usage-based disturbance counters is faulty automatically and/or without being commanded by an associated host device to perform a repair procedure.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

CONCLUSION

Although aspects of implementing usage-based disturbance counter repair have been described in language specific to certain features and/or methods, the subject of the appended claims is not necessarily limited to the specific features or methods described. Rather, the specific features and methods are disclosed as a variety of example implementations for usage-based disturbance counter repair.

What is claimed is:

1. An apparatus comprising:
a memory device comprising:
a memory array comprising multiple memory rows including a memory row corresponding to a memory row address;
multiple usage-based disturbance counters respectively associated with the multiple memory rows of the memory array, each respective usage-based disturbance counter of the multiple usage-based disturbance counters configured to count a respective quantity of at least one of accesses or activations of a respective memory row of the multiple memory rows of the memory array; and
usage-based disturbance counter repair circuitry coupled to the multiple usage-based disturbance counters, the usage-based disturbance counter repair circuitry comprising a register and a spare usage-based disturbance counter that can replace at least one usage-based disturbance counter of the multiple usage-based disturbance counters, the usage-based disturbance counter repair circuitry configured to:
store the memory row address in the register; and
update the spare usage-based disturbance counter responsive to an operation for the memory row corresponding to the memory row address stored in the register to replace a usage-based disturbance counter associated with the memory row while the memory row continues to be used to store data.

2. The apparatus of claim 1, wherein the usage-based disturbance counter repair circuitry is configured to:
compare a current memory row address for a current memory operation to the memory row address stored in the register;
responsive to the current memory row address being equal to the memory row address stored in the register, update the spare usage-based disturbance counter; and
responsive to the current memory row address being unequal to the memory row address stored in the register, update a usage-based disturbance counter of the multiple usage-based disturbance counters that corresponds to the current memory row address.

3. The apparatus of claim 1, wherein:
the usage-based disturbance counter repair circuitry is configured to assign different memory row addresses to the spare usage-based disturbance counter using the register; and
the memory device is configured to perform the operation for the memory row on the memory row in the memory array.

4. The apparatus of claim 1, wherein:
the operation for the memory row comprises an activation of the memory row corresponding to the memory row address stored in the register; and
the usage-based disturbance counter repair circuitry is configured to update the spare usage-based disturbance counter by incrementing a value stored in the spare usage-based disturbance counter responsive to the activation.

5. The apparatus of claim 1, wherein:
the operation for the memory row comprises at least one mitigation procedure performed on one or more memory rows affected by activations of the memory row corresponding to the memory row address stored in the register; and
the usage-based disturbance counter repair circuitry is configured to update the spare usage-based disturbance counter by clearing a value stored in the spare usage-based disturbance counter responsive to the at least one mitigation procedure.

6. The apparatus of claim 1, wherein the usage-based disturbance counter repair circuitry is configured to:

store another memory row address in the register in place of the memory row address, the other memory row address corresponding to another memory row of the multiple memory rows of the memory array;

clear the spare usage-based disturbance counter based on storage of the other memory row address in the register; and update the spare usage-based disturbance counter responsive to another operation for the other memory row corresponding to the other memory row address stored in the register to replace another usage-based disturbance counter associated with the other memory row while the other memory row continues to be used to store data.

7. The apparatus of claim 1, wherein the memory device further comprises:

one or more mode registers comprising one or more bits relating to a repair capability for the multiple usage-based disturbance counters, the repair capability pertaining to the spare usage-based disturbance counter that is configured to be assignable to correspond to different memory row addresses.

8. The apparatus of claim 7, wherein the one or more bits of the one or more mode registers comprise:

at least one bit indicative of entry to or exit from a repair mode that enables the repair capability for the multiple usage-based disturbance counters using the spare usage-based disturbance counter.

9. The apparatus of claim 1, wherein the memory device further comprises:

usage-based disturbance counter operational circuitry configured to:

track at least one of accesses or activations of the multiple memory rows using the multiple usage-based disturbance counters; and perform mitigation procedures on memory rows affected by the tracked accesses or activations.

10. The apparatus of claim 1, wherein:

each respective usage-based disturbance counter of the multiple usage-based disturbance counters corresponds to a respective memory row of the multiple memory rows of the memory array; and each respective usage-based disturbance counter and each respective memory row form a respective combined memory row comprising data bits for the respective memory row and counter bits for the respective usage-based disturbance counter.

11. The apparatus of claim 1, wherein the usage-based disturbance counter repair circuitry is configured to:

detect that the usage-based disturbance counter of the multiple usage-based disturbance counters is faulty, the usage-based disturbance counter that is faulty corresponding to the memory row that corresponds to the memory row address.

12. The apparatus of claim 11, wherein the usage-based disturbance counter repair circuitry is configured to:

perform the storage of the memory row address in the register responsive to the detection by the memory device that the usage-based disturbance counter of the multiple usage-based disturbance counters is faulty.

13. An apparatus comprising:

a memory device comprising:

an interface configured to be coupled to a host device; and usage-based disturbance counter repair circuitry coupled to the interface and configured to:

receive from the host device a first command that relates to repairing a faulty usage-based disturbance counter using a spare usage-based disturbance counter configured to be assignable to different memory row addresses of multiple memory row addresses;

receive from the host device a second command that relates to the repairing of the faulty usage-based disturbance counter using the spare usage-based disturbance counter;

store in a register a memory row address of the multiple memory row addresses responsive to at least one of the first command or the second command, the memory row address corresponding to a memory row that is associated with the faulty usage-based disturbance counter, the faulty usage-based disturbance counter configured to count a quantity of at least one of accesses or activations of the memory row of multiple memory rows of a memory array; and update the spare usage-based disturbance counter responsive to at least one of an access or an activation of the memory row corresponding to the memory row address stored in the register.

14. The apparatus of claim 13, wherein:

the spare usage-based disturbance counter is configured to be re-assignable to different memory row addresses of the multiple memory row addresses over time; and the usage-based disturbance counter repair circuitry is configured to increment the spare usage-based disturbance counter responsive to the at least one of an access or an activation of the memory row corresponding to the memory row address stored in the register.

15. The apparatus of claim 13, wherein the usage-based disturbance counter repair circuitry is configured to:

write at least one bit in at least one mode register to enter a repair mode enabling a volatile repair of the faulty usage-based disturbance counter responsive to at least the first command.

16. An apparatus comprising:

a host device comprising:

an interface configured to be coupled to a memory device; and usage-based disturbance counter repair circuitry coupled to the interface and configured to:

transmit to the memory device a first command that relates to repairing a faulty usage-based disturbance counter using a spare usage-based disturbance counter that is configured to be assignable to multiple memory row addresses of multiple memory rows of a memory array of the memory device; and transmit to the memory device a second command that relates to the repairing of the faulty usage-based disturbance counter using the spare usage-based disturbance counter, at least one of the first command or the second command configured to cause the memory device to:

store in a register a memory row address of the multiple memory row addresses, the memory row address corresponding to a memory row that is associated with the faulty usage-based disturbance counter, the faulty usage-based disturbance counter configured to count a quantity of at least one of accesses or activations of the memory row of the multiple memory rows of the memory array of the memory device; and update the spare usage-based disturbance counter responsive to at least one of an access or an activation of the memory row corresponding to the memory row address that is stored in the register.

17. The apparatus of claim 16, wherein the usage-based disturbance counter repair circuitry is configured to:

transmit to the memory device the first command to initiate the repairing of the faulty usage-based disturbance counter.

18. The apparatus of claim 17, wherein the usage-based disturbance counter repair circuitry is configured to:

transmit to the memory device the first command to write at least one bit in at least one mode register to enter a repair mode for the faulty usage-based disturbance counter.

19. The apparatus of claim 18, wherein the usage-based disturbance counter repair circuitry is configured to:

transmit to the memory device the second command to write to the at least one bit in the at least one mode register to exit the repair mode for the faulty usage-based disturbance counter.

20. The apparatus of claim 17, wherein the usage-based disturbance counter repair circuitry is configured to:

transmit to the memory device the second command including at least an indication of the memory row address to be assigned to the spare usage-based disturbance counter.

* * * * *